(12) United States Patent
Yamashina et al.

(10) Patent No.: US 8,507,982 B2
(45) Date of Patent: Aug. 13, 2013

(54) SEMICONDUCTOR DEVICE AND METHOD FOR FABRICATING THE SAME

(75) Inventors: Daigo Yamashina, Osaka (JP); Masaki Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/537,810

(22) Filed: Jun. 29, 2012

(65) Prior Publication Data

US 2012/0261750 A1  Oct. 18, 2012

Related U.S. Application Data

(63) Continuation of application No. PCT/JP2010/006419, filed on Oct. 29, 2010.

(30) Foreign Application Priority Data

Mar. 11, 2010  (JP) .................................. 2010-053972

(51) Int. Cl.
*H01L 29/78* (2006.01)

(52) U.S. Cl.
USPC .......................................................... 257/335

(58) Field of Classification Search
USPC .......... 257/327, 335, 339, 342–343, E29.066, 257/E29.256, E29.261
See application file for complete search history.

(56) References Cited

U.S. PATENT DOCUMENTS

| | | | |
|---|---|---|---|
| 6,207,518 B1 | 3/2001 | Akaishi et al. | |
| 6,873,021 B1 | 3/2005 | Mitros et al. | |
| 8,004,039 B2 * | 8/2011 | Zinn | 257/339 |
| 2003/0001198 A1 * | 1/2003 | Bromberger et al. | 257/327 |
| 2004/0251492 A1 * | 12/2004 | Lin | 257/335 |
| 2005/0062102 A1 * | 3/2005 | Dudek et al. | 257/335 |
| 2005/0153527 A1 * | 7/2005 | Kitamura | 438/514 |
| 2005/0167706 A1 * | 8/2005 | Dudek | 257/288 |

(Continued)

FOREIGN PATENT DOCUMENTS

| | | |
|---|---|---|
| JP | 10-256534 | 9/1998 |
| JP | 2001-185720 | 7/2001 |
| JP | 2004-063918 | 2/2004 |
| JP | 2005-129654 | 5/2005 |

OTHER PUBLICATIONS

International Search Report issued in International Patent Application No. PCT/JP2010/006419 dated Nov. 30, 2010.

*Primary Examiner* — Hsien Ming Lee
*Assistant Examiner* — Michele Fan
(74) *Attorney, Agent, or Firm* — McDermott Will & Emery LLP

(57) ABSTRACT

A semiconductor device includes a drift diffusion region of a first conductivity type, a body diffusion region of a second conductivity type, a source diffusion region of the first conductivity type, an insulating film buried in a trench formed in an upper portion of the drift diffusion region and spaced apart from the body diffusion region, a drain diffusion region of the first conductivity type formed in an upper portion of the drift diffusion region and adjacent to the insulating film on the opposite side of the insulating film from the source diffusion region, and a gate electrode formed on a portion of the body diffusion region, the drift diffusion region, and a portion of the insulating film. The drift diffusion region includes a substrate inner region, and a surface region containing an impurity of the first conductivity type at a higher concentration than that of the substrate inner region.

12 Claims, 16 Drawing Sheets

(56) References Cited

U.S. PATENT DOCUMENTS

| | | |
|---|---|---|
| 2007/0034894 A1 | 2/2007 | Kawaguchi et al. |
| 2007/0221967 A1* | 9/2007 | Khemka et al. ............... 257/288 |
| 2008/0308874 A1 | 12/2008 | Letavic et al. |
| 2009/0256212 A1* | 10/2009 | Denison et al. ............... 257/408 |
| 2010/0090278 A1* | 4/2010 | Rohrer ........................... 257/339 |
| 2010/0096696 A1 | 4/2010 | Kawaguchi et al. |
| 2010/0117150 A1* | 5/2010 | Pendharkar et al. .......... 257/337 |
| 2010/0127321 A1* | 5/2010 | Ko ................................. 257/327 |
| 2011/0180870 A1* | 7/2011 | Pendharkar ................... 257/337 |
| 2011/0220995 A1* | 9/2011 | Chou et al. .................... 257/335 |
| 2012/0018804 A1* | 1/2012 | Khemka et al. ............... 257/337 |
| 2012/0043608 A1* | 2/2012 | Yang et al. .................... 257/336 |
| 2012/0094457 A1* | 4/2012 | Gabrys .......................... 438/286 |

* cited by examiner

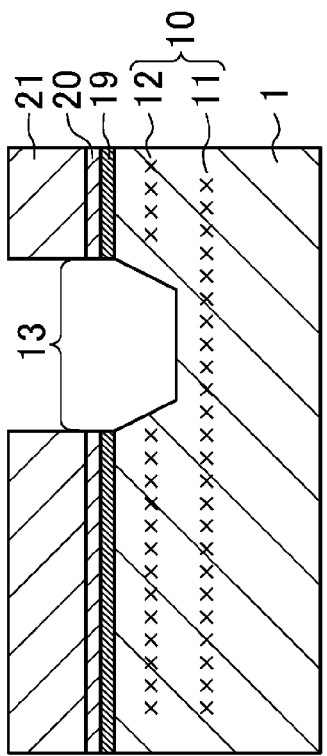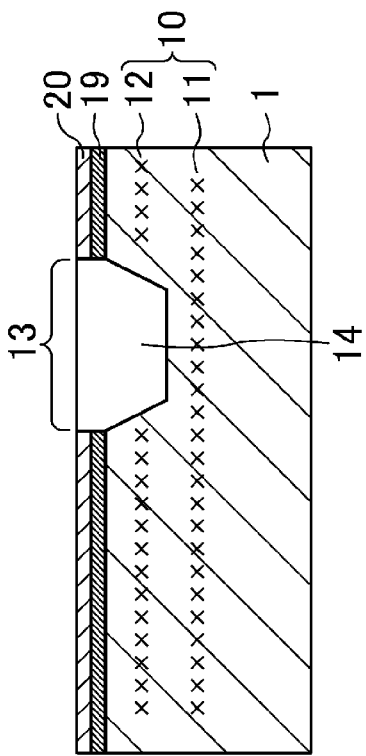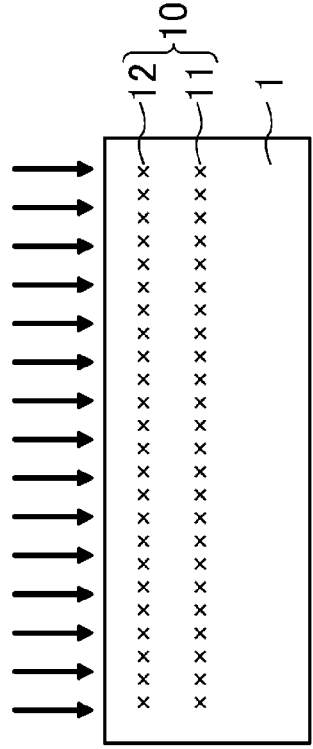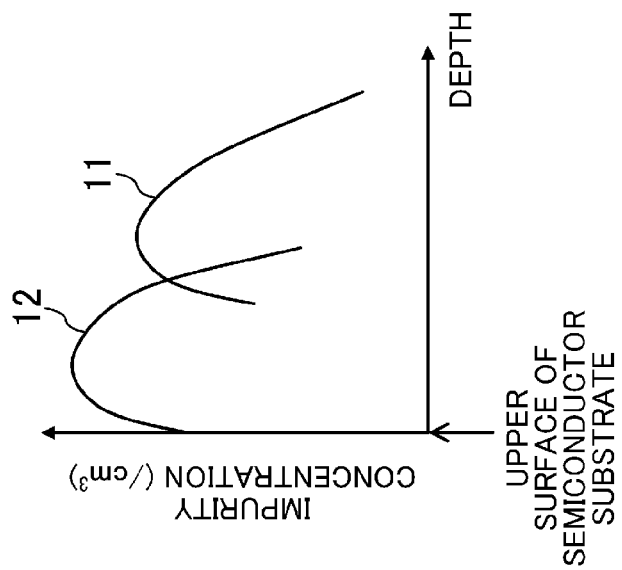

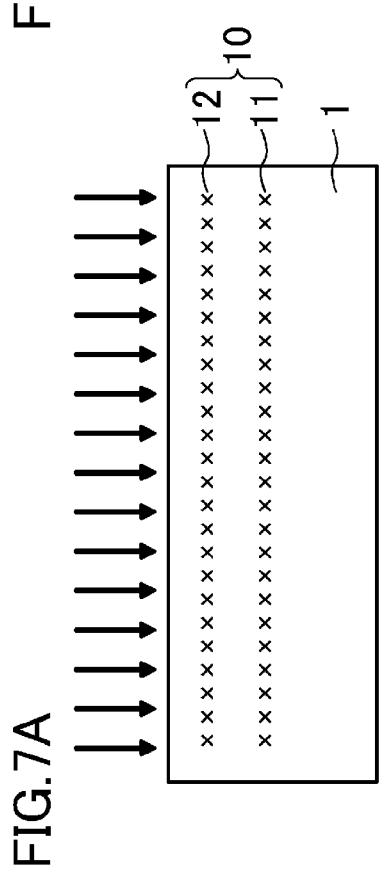
FIG.7A
FIG.7B
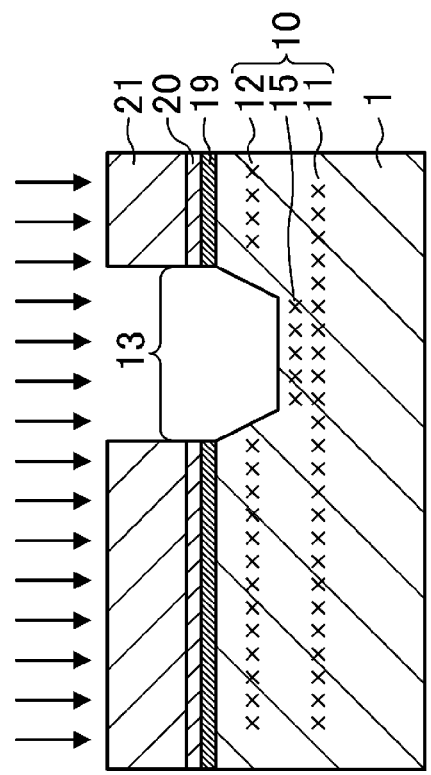
FIG.7C
FIG.7D

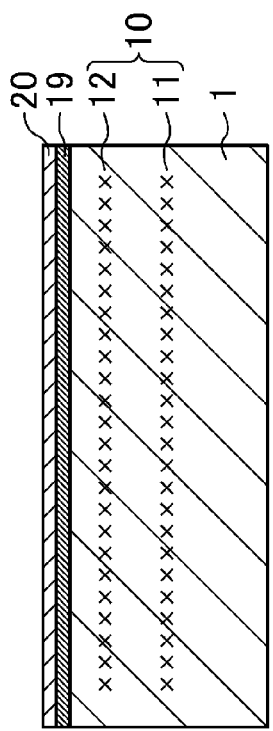
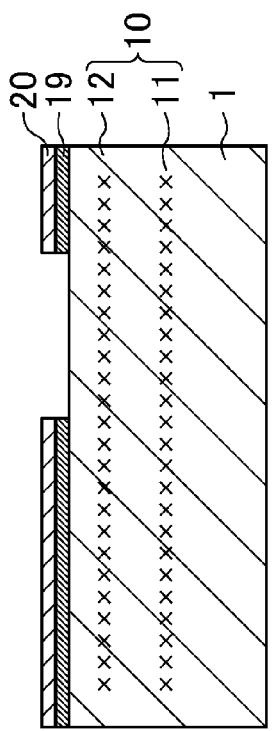
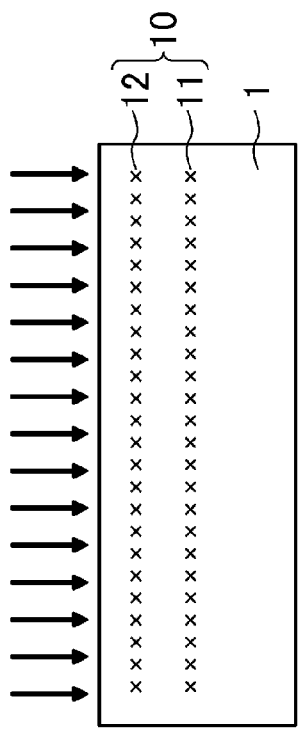
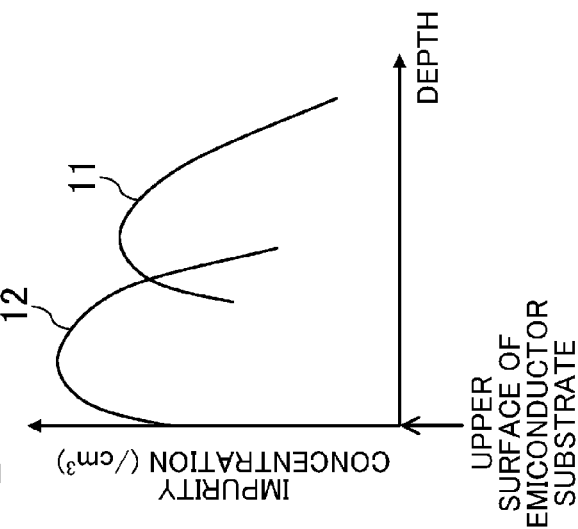

SEMICONDUCTOR DEVICE AND METHOD FOR FABRICATING THE SAME

CROSS-REFERENCE TO RELATED APPLICATIONS

This is a continuation of PCT International Application PCT/JP2010/006419 filed on Oct. 29, 2010, which claims priority to Japanese Patent Application No. 2010-053972 filed on Mar. 11, 2010. The disclosures of these applications including the specifications, the drawings, and the claims are hereby incorporated by reference in their entirety.

BACKGROUND

The technology disclosed herein relates to semiconductor devices and methods for fabricating the semiconductor devices, and more particularly, to laterally diffused metal oxide semiconductor (LDMOS) transistors, which have a low on resistance while keeping a sufficient breakdown voltage, and methods for fabricating the LDMOS transistors.

In recent years, as the performance, multi-functionality, and power consumption of electronic apparatuses have been improved, there has been a demand for semiconductor devices incorporated in the electronic apparatus which have a higher breakdown voltage, higher power, a smaller size, lower power consumption, etc. Among the semiconductor devices, even in the fields of driver IC, power supply IC, etc., there has been a demand for MOS electric field effect transistors (MOSFETs) which have a lower on resistance while keeping the breakdown voltage at a predetermined level in order to achieve lower power consumption.

To meet the demand, an LDMOS transistor has been proposed in which the channel region is formed by ion implantation and thermal treatment, whereby a short-channel device can be formed independently of the accuracy of a mask. In the LDMOS transistor, the on resistance can be reduced by decreasing the channel resistance component. Note that there is typically a trade-off between the on resistance and the breakdown voltage, and this also holds true for the LDMOS transistor. Therefore, a LOCOS offset LDMOS transistor has been proposed in which, in order to keep a sufficient breakdown voltage, a thick oxide film is formed by LOCOS between the drain region and an end portion of the gate electrode so that the gate electrode end portion is offset from the drain region (the position of the effective gate end portion is shifted), whereby an electric field concentrated at the gate electrode end portion can be reduced.

FIG. 17 is a cross-sectional view of a typical LDMOS transistor. Here, the LDMOS transistor (semiconductor device) is of N-channel type.

As shown in FIG. 17, the typical semiconductor device includes an LOCOS oxide film 303, a p-type body diffusion region 302, an n-type source diffusion region 306, and an n-type drain diffusion region 307 which are formed in an upper portion of an n-type semiconductor substrate 301. The source diffusion region 306 is formed in an upper portion of the body diffusion region 302. The LOCOS oxide film 303 is formed between the source diffusion region 306 and the drain diffusion region 307, and is spaced apart from the body diffusion region 302.

A gate insulating film 304 is formed on the semiconductor substrate 301 including the body diffusion region 302. A gate electrode 305 is formed on the gate insulating film 304, extending onto the LOCOS oxide film 303. An interlayer insulating film 323 is formed on the gate electrode 305, the LOCOS oxide film 303, and the semiconductor substrate 301 with openings being formed above the source diffusion region 306 and the drain diffusion region 307. A source electrode 316 is formed on a portion of the source diffusion region 306 above which an opening of the interlayer insulating film 323 is provided. A drain electrode 317 is formed on a portion of the drain diffusion region 307 above which an opening of the interlayer insulating film 323 is provided.

In the semiconductor device (LDMOS transistor) of FIG. 17, the channel is a portion of the body diffusion region 302 which is located directly below the gate electrode 305 and closer to the LOCOS oxide film 303 below the gate electrode 305 as viewed from the source diffusion region 306.

In the LDMOS transistor of FIG. 17, the breakdown voltage is determined by an electric field concentrated at an end portion closer to the source diffusion region 306 of the LOCOS oxide film 303 or at a region where a bottom corner portion of the body diffusion region 302 and an n-type portion of the semiconductor substrate 301 are joined together.

In the LDMOS transistor, the concentration of an n-type impurity is lower at a portion of a surface portion (a gap region 309) of the semiconductor substrate 301 which is located between the body diffusion region 302 and the LOCOS oxide film 303 than at a portion of the semiconductor substrate 301 which is located below the LOCOS oxide film 303. As a result, the concentration of an electric field is reduced at a bird's beak portion of an end portion closer to the source diffusion region 306 of the LOCOS oxide film 303, and therefore, the breakdown voltage can be improved compared to a semiconductor device in which the impurity concentration of the gap region 309 is not reduced.

SUMMARY

Japanese Patent Publication No. H10-256534 describes an LDMOS transistor in which, as described above, the electric field applied to the bird's beak portion of the end portion closer to the source diffusion region 306 of the LOCOS oxide film 303 is reduced by decreasing the n-type impurity concentration of the gap region 309, whereby the breakdown voltage is improved. However, the present inventors have found that, in this LDMOS transistor, the on resistance disadvantageously increases because the impurity concentration is reduced in a surface portion of the semiconductor substrate 301 which serves as a carrier path during the on state.

The present disclosure describes implementations of an LDMOS transistor which has a lower on resistance while keeping a sufficient breakdown voltage.

A semiconductor device according to an example of the present disclosure includes a drift diffusion region of a first conductivity type formed in an upper portion of a semiconductor substrate, a body diffusion region of a second conductivity type formed in an upper portion of the semiconductor substrate, a source diffusion region of the first conductivity type formed in an upper portion of the body diffusion region, an insulating film buried in a trench formed in an upper portion of the drift diffusion region, and spaced apart from the body diffusion region, a drain diffusion region of the first conductivity type formed in an upper portion of the drift diffusion region and adjacent to the insulating film on an opposite side of the insulating film from the source diffusion region, and a gate electrode formed on a portion of the body diffusion region, the drift diffusion region, and a portion of the insulating film with a gate insulating film being interposed between the gate electrode, and the portion of the body diffusion region, the drift diffusion region, and the portion of the insulating film. The drift diffusion region includes a substrate inner region, and a surface region formed on the substrate inner region and below the gate electrode and containing an impurity of the first conductivity type at a higher concentration than that of the substrate inner region.

With this configuration, the surface region serves as a part of a carrier path from the source diffusion region to the drain diffusion region, and the impurity concentration of the surface region is higher than that of the substrate inner region, whereby the resistance of the semiconductor device in the on state can be reduced. On the other hand, the impurity concentration is increased only at a portion of the drift diffusion region. Therefore, the breakdown voltage does not change significantly compared to when the impurity concentration of the surface region is not increased. Moreover, the insulating film formed between the source diffusion region and the drain diffusion region is buried in the trench. Therefore, the concentration of an electric field is reduced compared to when a LOCOS oxide film is used as the insulating film, whereby the breakdown voltage can be improved.

Note that the first conductivity type may be n-type and the second conductivity type may be p-type, or alternatively, the first conductivity type may be p-type and the second conductivity type may be n-type.

A method for fabricating a semiconductor device according to an example of the present disclosure includes the steps of (a) implanting impurity ions of a first conductivity type into a semiconductor substrate by first ion implantation to form a substrate inner region of the first conductivity type, implanting impurity ions of the first conductivity type into the semiconductor substrate by second ion implantation with lower implantation energy and a higher dose than those of the first ion implantation to form a surface region of the first conductivity type at a shallower position than that of the substrate inner region, thereby forming a drift diffusion region including the substrate inner region and the surface region, (b) forming a trench in a predetermined portion of the drift diffusion region, (c) forming an insulating film filling the trench, (d) forming a gate electrode on the semiconductor substrate and the insulating film with a gate insulating film being interposed between the gate electrode and the semiconductor substrate, (e) forming a body diffusion region of a second conductivity type in an upper portion of the semiconductor substrate below an end portion in a gate length direction of the gate electrode, and (f) forming a source diffusion region of the first conductivity type in an upper portion of the body diffusion region, and a drain diffusion region of the first conductivity type in an upper portion of the drift diffusion region in a region adjacent to the insulating film on an opposite side of the insulating film from the source diffusion region.

According to this method, the impurity concentration of the surface region which serves as a part of a carrier path can be made higher than that of the substrate inner region, whereby the on resistance of the semiconductor device can be reduced. Moreover, the trench is provided in the drift diffusion region, and the insulating film is formed to fill the trench. Therefore, the concentration of an electric field at an end portion closer to the source diffusion region of the insulating film can be reduced compared to when the insulating film is formed by LOCOS.

As described above, in the semiconductor device of the example of the present disclosure, the impurity concentration of the surface region of the drift diffusion region of the first conductivity type is higher than that of the substrate inner region, and the insulating film buried in the trench is formed at an end portion (an end portion closer to the source diffusion region of the insulating film) of the gate electrode at which an electric field is concentrated. Therefore, a semiconductor device which can have a lower on resistance while keeping a sufficient breakdown voltage and a method for fabricating the semiconductor device, can be obtained.

BRIEF DESCRIPTION OF THE DRAWINGS

FIG. 3 is a cross-sectional view showing a carrier path which occurs when the LDMOS transistor of the embodiment of the present disclosure is on.

FIGS. 4A, 4C, and 4D are cross-sectional views showing steps of a method for fabricating the LDMOS transistor of this embodiment.

FIG. 4B is a diagram showing a distribution of n-type impurity concentration in a semiconductor substrate in the step of FIG. 4A.

FIGS. 7A, 7C, and 7D are cross-sectional views for describing steps of a method for fabricating the LDMOS transistor of the first variation.

FIG. 7B is a diagram showing a distribution of n-type impurity concentration in a semiconductor substrate in the step of FIG. 7A.

FIGS. 11A, 11C, and 11D are cross-sectional views for describing steps of the method for fabricating the LDMOS transistor of the second variation.

FIG. 11B is a diagram showing a distribution of n-type impurity concentration in the semiconductor substrate in the step of FIG. 11A.

DETAILED DESCRIPTION

A semiconductor device according to an embodiment of the present disclosure will be described with reference to the accompanying drawings. In the description that follows, it is assumed that a first conductivity type is n-type and a second conductivity type is p-type. Conversely, the first conductivity type may be p-type and the second conductivity type may be n-type, and in this case, advantages similar to those of an LDMOS transistor having the opposite conductivity type can be obtained. Although a configuration of a single transistor including a source, a drain, a gate electrode, and a gate insulating film will be described hereinafter for ease of understanding, a semiconductor device typically includes a plurality of LDMOS transistors provided on a semiconductor substrate. Note that the materials, sizes, and thicknesses of components, the concentrations of impurities, etc. described in the embodiment and its variations are only for illustrative purposes, and the present disclosure is not limited to those. Various changes and modifications can be made to the configurations of semiconductor devices according to the embodiment and variations without departing the scope and spirit of the present disclosure. The configurations of the semiconductor devices according to the embodiment and variations may be combined as appropriate.

Embodiment

Figure 1:
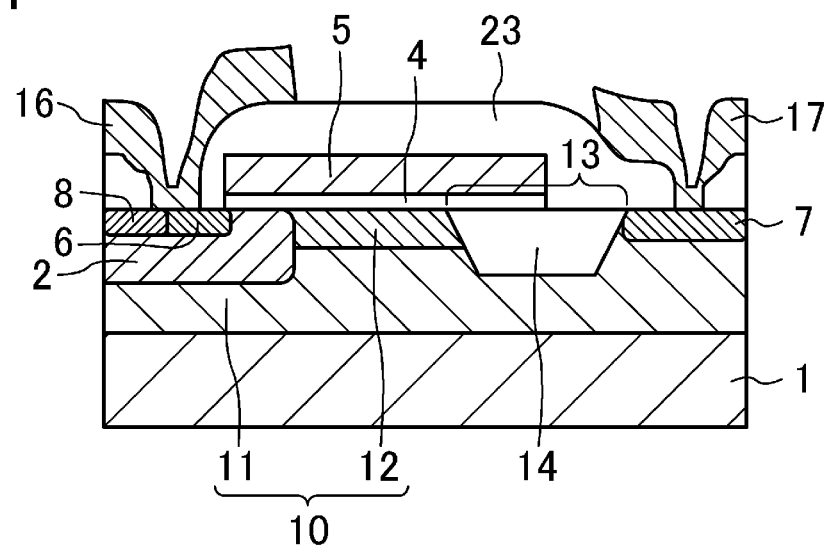
FIG. 1 is a cross-sectional view of an LDMOS transistor according to an embodiment of the present disclosure.

FIG. 1 is a cross-sectional view of an LDMOS transistor (semiconductor device) according to an embodiment of the present disclosure. As shown in FIG. 1, the LDMOS transistor of this embodiment includes a p-type (second conductivity type) semiconductor substrate 1, an n-type (first conductivity type) drift diffusion region 10 formed in an upper portion of the semiconductor substrate 1, a p-type body diffusion region 2 formed in an upper portion of the drift diffusion region 10 (i.e., an upper portion of the semiconductor substrate 1), a p-type backgate diffusion region 8 and an n-type source diffusion region 6 which are formed in an upper portion of the body diffusion region 2 and contact each other, an n-type drain diffusion region 7 formed in an upper portion of the drift diffusion region 10, and an oxide film (insulating film) 14 formed between the source diffusion region 6 and the drain diffusion region 7 and spaced apart from the source diffusion region 6 and the body diffusion region 2. The oxide film 14 is buried in a trench 13 formed in an upper portion of the drift diffusion region 10.

The LDMOS transistor also includes: a gate insulating film 4 formed on a portion of the body diffusion region 2, the drift diffusion region 10, and a portion of the oxide film 14; a gate electrode 5 formed on the gate insulating film 4; an interlayer insulating film 23 formed on the gate electrode 5 and the semiconductor substrate 1 and having openings above the source diffusion region 6 and the backgate diffusion region 8 and above the drain diffusion region 7; a source electrode 16 formed on a portion of the source diffusion region 6 and a portion of the backgate diffusion region 8; and a drain electrode 17 formed on the drain diffusion region 7. An end portion in the gate length direction of the gate electrode 5 is located on the body diffusion region 2 or the source diffusion region 6, and the other end portion is located on the oxide film 14.

The interlayer insulating film 23 is made of, for example, borophosphosilicate glass (BPSG) etc. The gate electrode 5 is located between the source diffusion region 6 and the drain diffusion region 7 as viewed from above. The backgate diffusion region 8 contains a p-type impurity at a higher concentration than that of the semiconductor substrate 1. The backgate diffusion region 8 is located on the opposite side of the source diffusion region 6 from the drain diffusion region 7.

In the semiconductor device of this embodiment, the drift diffusion region 10 includes an n-type surface region 12 formed in a region which is located directly below the gate electrode 5 (the gate insulating film 4) and between the body diffusion region 2 and the oxide film 14, and a substrate inner region 11 located below the surface region 12 and having a lower n-type impurity concentration than that of the surface region 12. The n-type impurity concentrations of the substrate inner region 11 and the surface region 12 are lower than the n-type impurity concentrations of the source diffusion region 6 and the drain diffusion region 7. A pn junction is formed between the surface region 12 and the body diffusion region 2.

In the LDMOS transistor of this embodiment, the n-type impurity concentration of the surface region 12 of the drift diffusion region 10 which serves as a carrier path during the on state is higher than that of the other portion of the drift diffusion region 10, whereby the resistance of the surface region 12 is reduced, resulting in a reduction in the on resistance.

Figure 17:
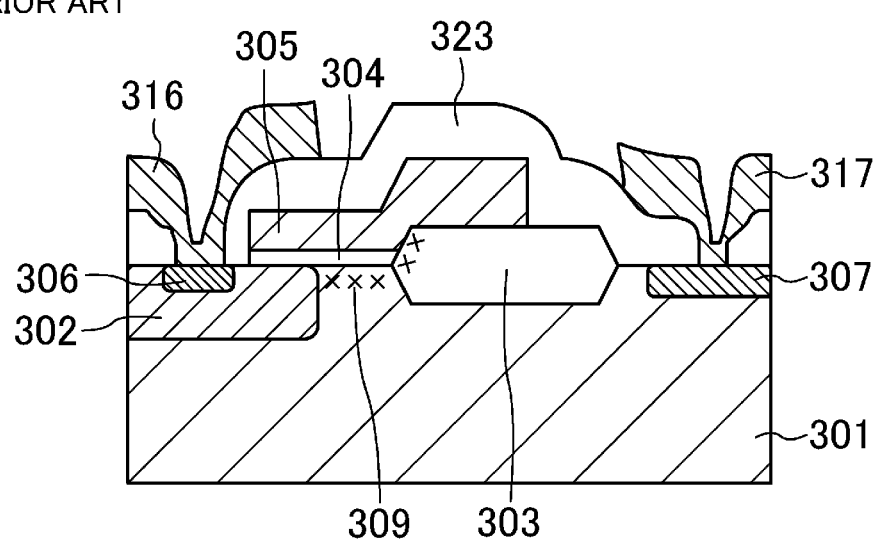
FIG. 17 is a cross-sectional view showing a typical LDMOS transistor.

Note that, as shown in FIG. 17, in a typical LDMOS transistor in which the offset region is formed of an LOCOS oxide film, if the impurity concentration of the surface region of the drift diffusion region is increased, an electric field is concentrated at the bird's beak portion of the end portion closer to the source diffusion region 306 of the LOCOS oxide film 303, and therefore, the breakdown voltage decreases.

In contrast to this, in the LDMOS transistor of this embodiment of FIG. 1, the trench 13 is formed in a portion of the semiconductor substrate 1 which is located below an end portion closer to the drain diffusion region 7 of the gate electrode 5. Thus, the surface region 12 having a high impurity concentration is removed from a portion of the semiconductor substrate 1 at which an electric field is likely to be concentrated. Therefore, the concentration of an electric field can be reduced at a portion of the drift diffusion region 10 which is located in the vicinity of the end portion closer to the drain diffusion region 7 of the gate electrode 5, whereby the decrease in the breakdown voltage can be reduced or prevented.

Incidentally, a typical LDMOS has a larger cell area than that of, for example, a core transistor of an integrated circuit, in order to obtain a higher breakdown voltage. Therefore, LOCOS, which is easier than shallow trench isolation (STI), is more commonly used to form an isolation region. In the LDMOS transistor of this embodiment, the isolation region (not shown) and the oxide film 14 are formed by STI, which is employed by the present inventors based on their study of the configuration for reducing the concentration of an electric field.

Next, the reason why the LDMOS transistor of this embodiment can have a lower on resistance while keeping a sufficient breakdown voltage will be described with reference to FIGS. 2 and 3.

Figure 2:
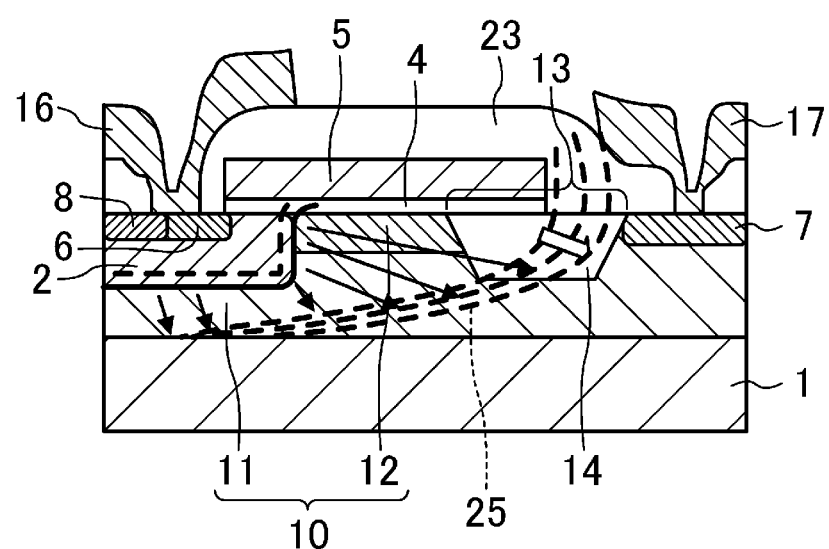
FIG. 2 is a cross-sectional view showing extension of a depletion layer which occurs when the LDMOS transistor of the embodiment of the present disclosure is off.

FIG. 2 is a cross-sectional view showing extension of a depletion layer 25 which occurs when the LDMOS transistor of the embodiment of the present disclosure is off. As shown in FIG. 2, because the trench 13 is formed below the end portion closer to the drain diffusion region 7 of the gate electrode 5, a potential gradient at the end of the gate electrode 5 can be decreased, and therefore, the depletion layer 25 during the on state can be extended toward the drain diffusion region 7. Therefore, in the LDMOS transistor of this embodiment, even if the concentration of the surface region 12 located directly below the gate electrode 5 is increased, the breakdown voltage is less likely to decrease.

Figure 3:
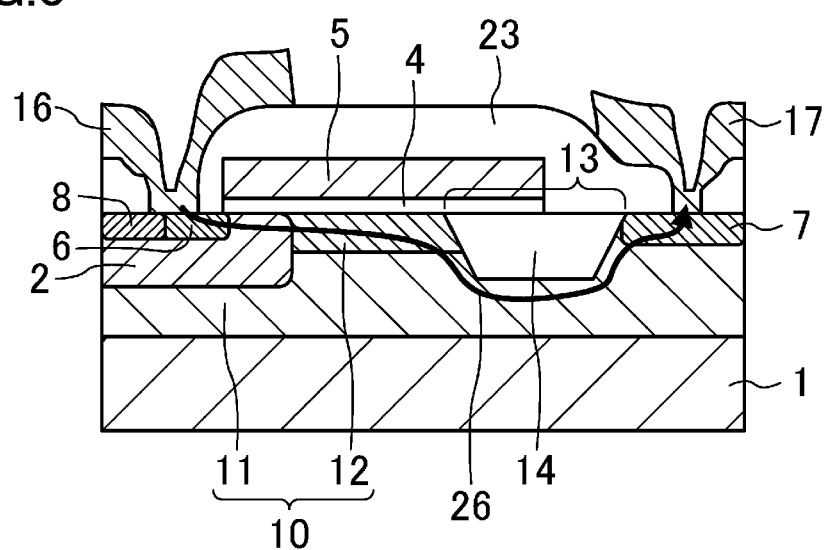

On the other hand, FIG. 3 is a cross-sectional view showing a carrier path 26 which occurs when the LDMOS transistor of the embodiment of the present disclosure is on. As shown in FIG. 3, carriers flow from the source diffusion region 6 into the drift diffusion region 10 via an inversion layer which occurs in a surface portion of the body diffusion region 2 during the on state. The carriers flowing into the drift diffusion region 10 flow into the drain diffusion region 7 via the surface region 12 of the drift diffusion region 10. In the LDMOS transistor of this embodiment, the impurity concentration of the surface region 12 is higher than that of the other portion (the substrate inner region 11) of the drift diffusion region 10, and therefore, the resistance component of the drift diffusion region 10 is reduced, whereby the on resistance can be reduced. Note that the n-type impurity concentration of the substrate inner region 11 of the drift diffusion region 10 is preferably, for example, about $1\times10^{16}$ cm$^{-3}$ to about $5\times10^{16}$ cm$^{-3}$, and the impurity concentration of the surface region 12 is preferably, for example, about $2\times10^{16}$ cm$^{-3}$ to about $8\times10^{16}$ cm$^{-3}$.

FIGS. 4A, 4C, 4D, and 5A-5C are cross-sectional views showing steps of a method for fabricating the LDMOS transistor of this embodiment. FIG. 4B is a diagram showing a distribution of n-type impurity concentration in the semiconductor substrate in the step of FIG. 4A. FIG. 5D is a plan view showing the LDMOS transistor after the end of the step of FIG. 5C. In FIG. 5D, for ease of understanding, the source electrode 16 and the drain electrode 17 are not shown, and the interlayer insulating film 23 is shown only at an opening for forming an electrode.

Initially, as shown in FIG. 4A, the n-type drift diffusion region 10 is formed in an upper portion of the p-type semiconductor substrate 1. Specifically, n-type impurity ions are implanted into the upper portion of the semiconductor substrate 1 two times or more with different implantation energy levels, where the dose for implantation into a shallow position is set to be larger than the dose for implantation into a deep position. As a result, the n-type impurity concentration of the surface region 12 of the drift diffusion region 10 can be made higher than the n-type impurity concentration of the substrate inner region 11.

Here, the n-type impurity which is implanted is, for example, phosphorus. In order to form the substrate inner region 11, the n-type impurity is implanted at least once, where the implantation dose is about $1\times10^{12}$ cm$^{-2}$ to about $6\times10^{12}$ cm$^{-2}$, and the acceleration energy is 100 keV or more. In order to form the surface region 12, the n-type impurity is implanted at least once, where the implantation dose is about $2\times10^{12}$ cm$^{-2}$ to about $1\times10^{13}$ cm$^{-2}$, and the acceleration energy is 80 keV or less. The drift diffusion region 10 thus formed has a concentration profile, such as that shown in FIG. 4B, immediately after the implantation.

Next, as shown in FIG. 4C, an oxide film 19 and a nitride film 20 are successively formed on the semiconductor substrate 1, and thereafter, a resist 21 is applied onto the nitride film 20 and then developed, so that an opening is formed in a predetermined region of the resist 21 spaced apart from a region where the body diffusion region 2 is to be formed. Next, the nitride film 20 and the oxide film 19 are successively partially removed by etching using the resist 21 as a mask. Next, the trench 13 is formed in an upper portion of the semiconductor substrate 1 (the drift diffusion region 10) by etching. Here, the trench 13 has a depth of, for example, about 0.4-2.0 μm, and reaches at least the surface region 12.

Next, as shown in FIG. 4D, the resist 21 is removed, and thereafter, the oxide (e.g., silicon oxide) film 14 is formed as an insulating film above the semiconductor substrate 1 by chemical vapor deposition (CVD) to fill the trench 13. Next, chemical mechanical polishing (CMP) is performed on the oxide film 14 to remove the oxide film 14 from the nitride film 20. In this planarization process, the nitride film 20 functions as a stopper for the CMP process. Thus, the trench 13 in which the oxide film 14 is buried can be formed simultaneously with an STI structure for isolating elements.

Figure 5C:
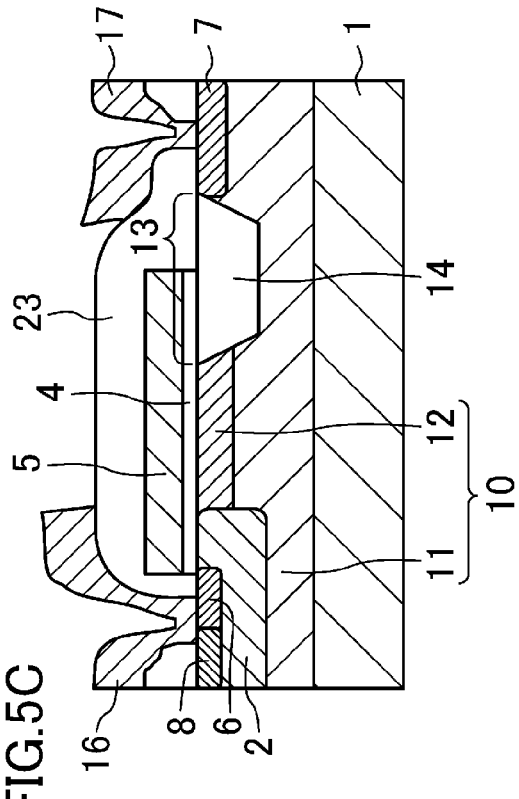
FIGS. 5A-5C are cross-sectional views showing steps of the method for fabricating the LDMOS transistor of this embodiment.
Figure 5D:
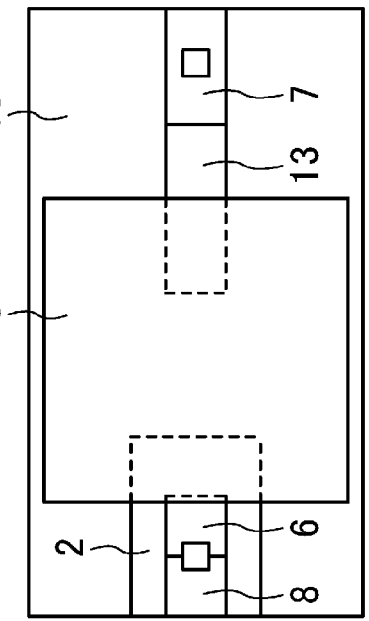
FIG. 5D is a plan view showing the LDMOS transistor after the end of the step of FIG. 5C.
Figure 5A:
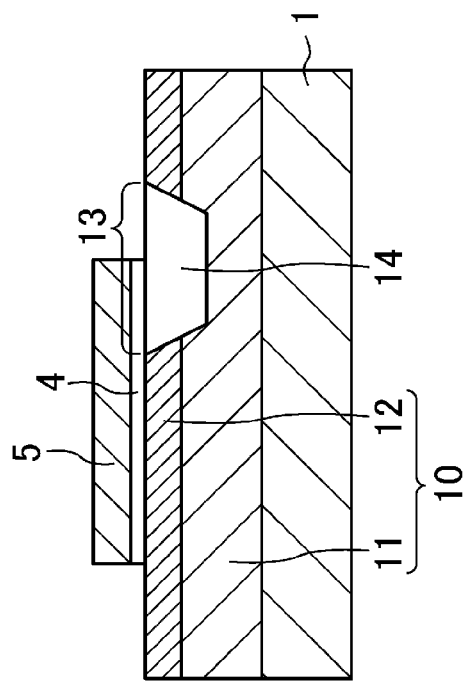

Next, as shown in FIG. 5A, the nitride film 20 and the oxide film 19 are removed by etching, and thereafter, the gate insulating film 4 is formed on the semiconductor substrate 1 by thermal oxidation, and the gate electrode 5 is formed on the semiconductor substrate 1 and the oxide film 14 with the gate insulating film 4 being interposed between the gate electrode 5 and the semiconductor substrate 1. Here, for example, the gate insulating film 4 has a thickness of about 2-100 nm. The gate insulating film 4 can be formed simultaneously with the gate insulating film of a low-voltage transistor in a logic portion embedded on the same substrate of the LDMOS transistor of this embodiment.

Figure 5B:
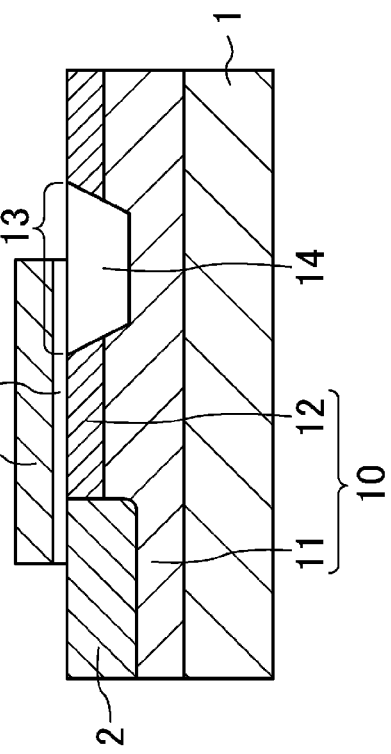

Next, as shown in FIG. 5B, the p-type body diffusion region 2 is formed in an upper portion of the semiconductor substrate 1 (the drift diffusion region 10) below an end portion in the gate length direction of the gate electrode 5. Here, p-type impurity ions are implanted into the upper portion of the semiconductor substrate 1 (the drift diffusion region 10) using the gate electrode 5 as a mask under conditions that, for example, the implantation energy is 80-150 keV, the implantation dose is about $1\times10^{13}$ cm$^{-2}$ to about $1\times10^{14}$ cm$^{-2}$, and the implantation depth is about 0.2-1.2 μm. These implantation conditions are only for illustrative purposes, and may be modified as appropriate, depending on the desired breakdown voltage, threshold, and current capability.

Next, as shown in FIGS. 5C and 5D, the source diffusion region 6 of the first conductivity type (n-type) is formed in an upper portion of the body diffusion region 2 by a known ion implantation technique etc., and the backgate diffusion region 8 containing an impurity of the second conductivity type (p-type) at a high concentration (higher than that of the other portion of the body diffusion region 2) is formed in an upper portion of the body diffusion region 2 at a position where the backgate diffusion region 8 and the source diffusion region 6 do not overlap. Simultaneously with the source diffusion region 6, the n-type drain diffusion region 7 is formed in an upper portion of the drift diffusion region 10 in a region which is adjacent to the oxide film 14 on the opposite side of the oxide film 14 (and the gate electrode 5) from the source diffusion region 6.

Next, the interlayer insulating film 23 made of BPSG etc. is formed on the gate electrode 5 and an upper surface of the semiconductor substrate 1. Thereafter, the source electrode 16 made of a metal etc. is formed on the source diffusion region 6 and the backgate diffusion region 8, and the drain electrode 17 made of a metal etc. is formed on the drain diffusion region 7. By the above steps, the LDMOS transistor of FIG. 1 can be fabricated.

In the LDMOS transistor of this embodiment, when another semiconductor element having an STI structure is embedded on the same substrate, the oxide film 14 can be formed simultaneously with the isolation region, and therefore, the number of steps does not increase. Although the surface region 12 of the drift diffusion region 10 contains the n-type impurity at a higher concentration than that of the substrate inner region 11, the surface region 12 can be formed by ion implantation using the same mask that is used to form the substrate inner region 11. Therefore, the resistance of the semiconductor device can be reduced and the breakdown voltage of the semiconductor device can be increased without a significant increase in the number of steps, compared to conventional semiconductor devices.

First Variation of Embodiment

Figure 6:
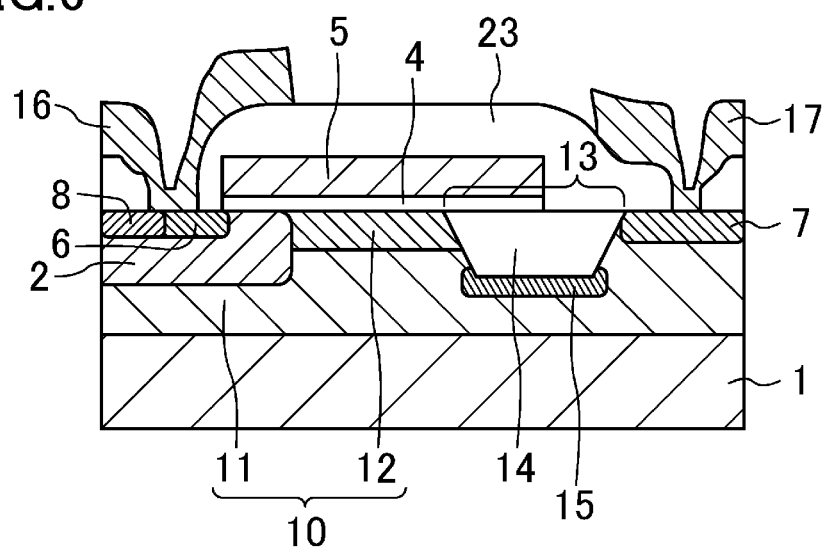
FIG. 6 is a cross-sectional view showing an LDMOS transistor according to a first variation of the embodiment of the present disclosure.

FIG. 6 is a cross-sectional view showing an LDMOS transistor according to a first variation of the embodiment of the present disclosure. The LDMOS transistor of this variation is different from that of FIG. 1 in that a drift diffusion portion 15 containing an n-type impurity at a higher concentration than that of the substrate inner region 11 is formed in a region located directly below the oxide film 14.

Specifically, the LDMOS transistor of this variation includes a p-type (second conductivity type) semiconductor substrate 1, an n-type (first conductivity type) drift diffusion region 10 formed in an upper portion of the semiconductor substrate 1, a p-type body diffusion region 2 formed in an upper portion of the drift diffusion region 10, a p-type backgate diffusion region 8 and an n-type source diffusion region 6 which are formed in an upper portion of the body diffusion region 2 and contact each other, an n-type drain diffusion region 7 formed in an upper portion of the drift diffusion region 10, and an oxide film (insulating film) 14 formed between the source diffusion region 6 and the drain diffusion region 7 and spaced apart from the source diffusion region 6 and the body diffusion region 2.

The LDMOS transistor further includes: a gate insulating film 4 formed on a portion of the body diffusion region 2, the drift diffusion region 10, and a portion of the oxide film 14; a gate electrode 5 formed on the gate insulating film 4; an interlayer insulating film 23 formed on the gate electrode 5 and the semiconductor substrate 1 and having openings above the source diffusion region 6 and the backgate diffusion region 8 and above the drain diffusion region 7; a source electrode 16 formed on a portion of the source diffusion region 6 and a portion of the backgate diffusion region 8; and a drain electrode 17 formed on the drain diffusion region 7.

The gate electrode 5 is located between the source diffusion region 6 and the drain diffusion region 7 as viewed from above. The backgate diffusion region 8 contains a p-type impurity at a higher concentration than that of the semiconductor substrate 1. The backgate diffusion region 8 is provided on the opposite side of the source diffusion region 6 from the drain diffusion region 7.

In the semiconductor device of this variation, the drift diffusion region 10 includes an n-type surface region 12 formed in a region which is located directly below the gate electrode 5 (the gate insulating film 4) and between the body diffusion region 2 and the oxide film 14, a substrate inner region 11 located below the surface region 12 and containing an n-type impurity at a lower concentration than that of the surface region 12, and the drift diffusion portion 15 formed at a bottom surface portion of the trench 13 and containing an n-type impurity at a higher concentration than that of the substrate inner region 11. The n-type impurity concentrations of the substrate inner region 11, the surface region 12, and the drift diffusion portion 15 are lower than those of the source diffusion region 6 and the drain diffusion region 7.

In the LDMOS transistor of this variation, the n-type impurity concentration of the surface region 12 of the drift diffusion region 10 which serves as a carrier path during the on state is higher than that of the substrate inner region 11. Therefore, compared to conventional LDMOS transistors, the resistance of the surface region 12 is reduced, resulting in a reduction in the on resistance.

Note that, in a typical LDMOS transistor including an offset region formed by LOCOS, such as that shown in FIG. 17, if the impurity concentration of the surface region of the drift diffusion region is increased, an electric field is concentrated at the bird's beak portion of the end portion closer to the source diffusion region 306 of the LOCOS oxide film 303, resulting in a decrease in the breakdown voltage. In other words, in the typical LDMOS transistor, an electric field is likely to be concentrated in the vicinity of the end portion closer to the drain diffusion region 7 of the gate electrode 5.

In contrast to this, in the LDMOS transistor of this embodiment of FIG. 1, the trench 13 is formed in a region of the semiconductor substrate 1 which is located in the vicinity of the end portion closer to the drain diffusion region 7 of the gate electrode 5. Thus, the surface region 12 having a high impurity concentration is removed from a region in the vicinity of the end portion. Therefore, the concentration of an electric field at a portion of the drift diffusion region 10 which is located in the vicinity of the end portion closer to the drain diffusion region 7 of the gate electrode 5 can be reduced, whereby the decrease in the breakdown voltage can be reduced or prevented.

Also, in the LDMOS transistor of FIG. 17, if the n-type impurity concentration of an entire region (a region corresponding to the drift diffusion region 10 of FIG. 6) of the semiconductor substrate 301 which is located between the body diffusion region 302 and the drain diffusion region 307 is increased to reduce the on resistance, an electric field is concentrated at a bottom corner portion of the body diffusion region 302, resulting in a decrease in the breakdown voltage.

In contrast to this, in the LDMOS transistor of this variation, the n-type impurity concentration of the bottom surface portion (the drift diffusion portion 15) of the trench 13 of the semiconductor substrate 1 which serves as a carrier path during the on state is locally increased, and the n-type impurity concentration of the substrate inner region 11 contacting a curvature region of the body diffusion region 2 is not increased. Therefore, the on resistance can be reduced without leading to a decrease in the breakdown voltage.

Figure 8A:
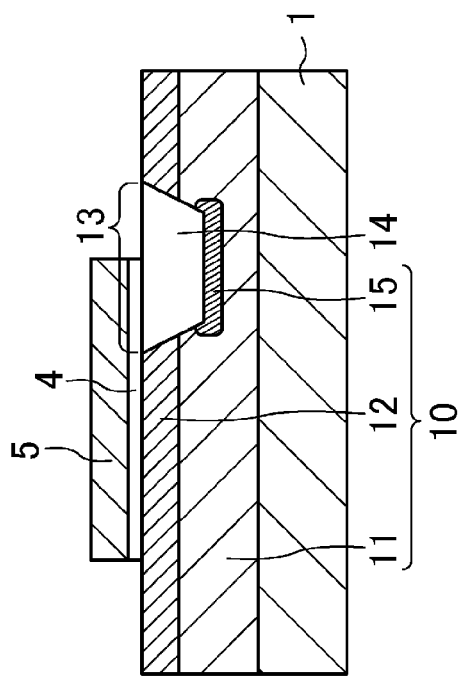
FIG. 8A is a diagram showing the n-type impurity concentration of the semiconductor substrate at the same depth as that of a bottom portion of a trench, in the LDMOS transistor after the end of the step of FIG. 7D.

Next, a method for fabricating the LDMOS transistor of the first variation will be described. FIGS. 7A, 7C, 7D, 8B-8D, and 9B are cross-sectional views for describing steps of the method for fabricating the LDMOS transistor of this variation. FIG. 7B is a diagram showing a distribution of n-type impurity concentration in the semiconductor substrate in the step of FIG. 7A. FIG. 8A is a diagram showing the n-type impurity concentration of the semiconductor substrate 1 at the same depth as that of the bottom portion of the trench 13, in the LDMOS transistor after the end of the step of FIG. 7D.

Figure 8B:
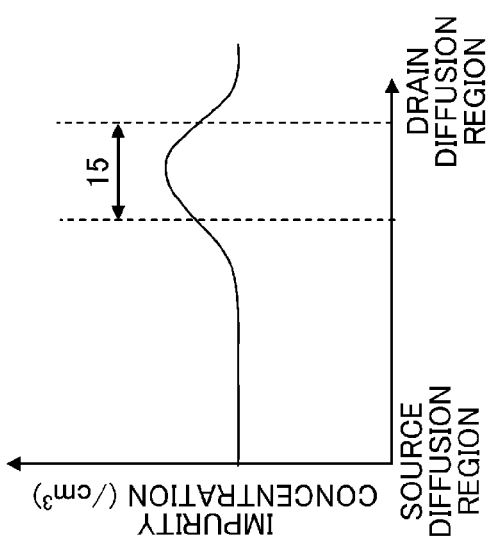
FIGS. 8B-8D are cross-sectional views for describing steps of the method for fabricating the LDMOS transistor of the first variation.
Figure 8C:
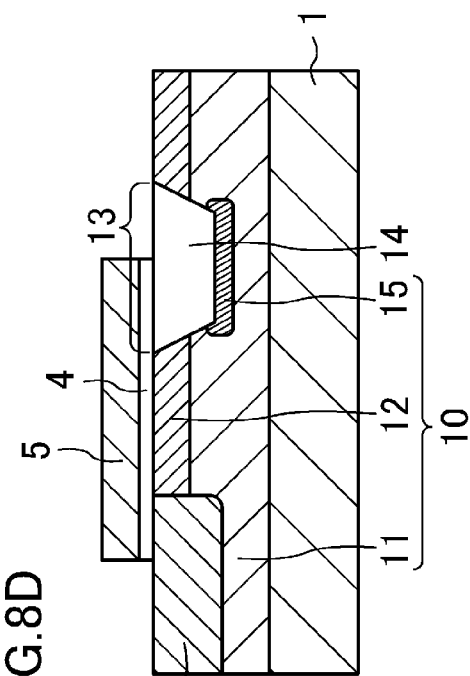
Figure 8D:
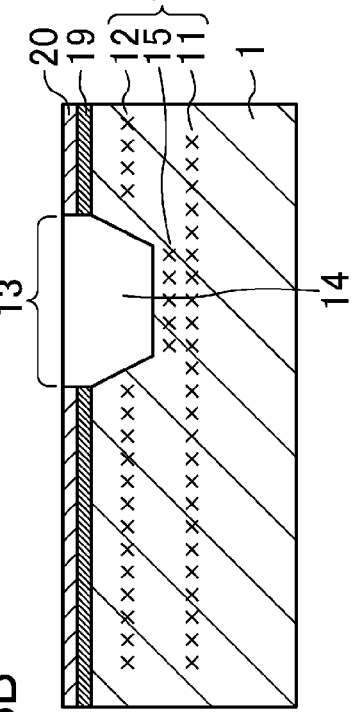
Figure 9A:
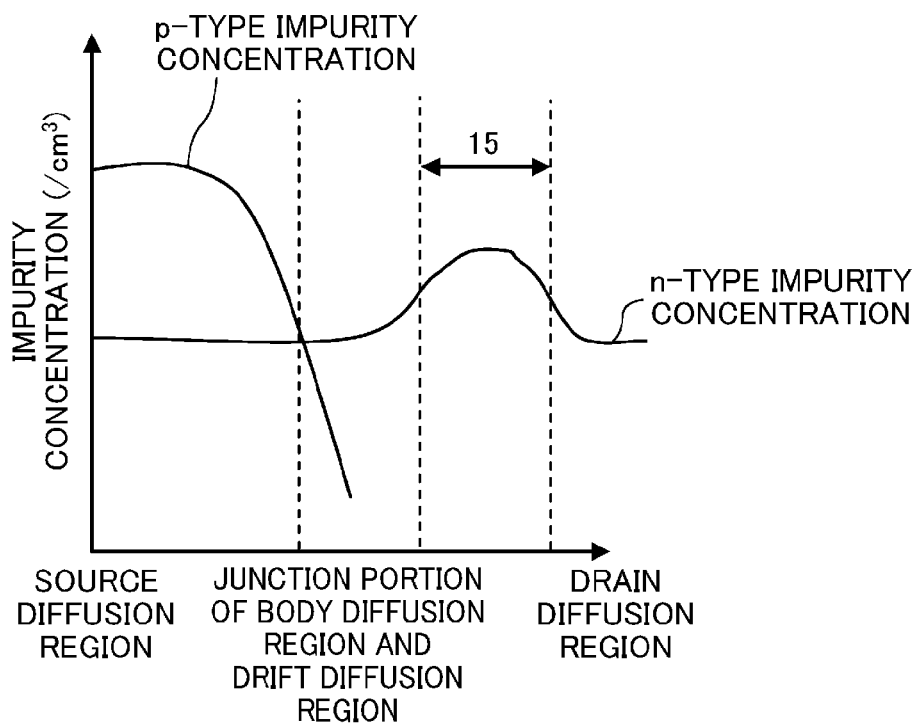
FIG. 9A is a diagram showing the impurity concentration of the semiconductor substrate at the same depth as that of the bottom portion of the trench, in the LDMOS transistor after the end of the step of FIG. 8D.

FIG. 9A is a diagram showing the impurity concentration of the semiconductor substrate 1 at the same depth as that of the bottom portion of the trench 13, in the LDMOS transistor after the end of the step of FIG. 8D.

Initially, as shown in FIG. 7A, the n-type drift diffusion region 10 is formed in the p-type semiconductor substrate 1. Specifically, n-type impurity ions are implanted two times or more with different implantation energy levels, where the dose for implantation into a shallow position is set to be larger than the dose for implantation into a deep position. As a result, the n-type impurity concentration of the surface region 12 of the drift diffusion region 10 can be made higher than the n-type impurity concentration of the inner region 11. Here, the n-type impurity which is implanted is, for example, phosphorus. In order to form the substrate inner region 11, the n-type impurity is implanted at least once, where the implantation dose is about $1 \times 10^{12}$ cm$^{-2}$ to about $6 \times 10^{12}$ cm$^{-2}$, and the acceleration energy is 100 keV or more. In order to form the surface region 12, the n-type impurity is implanted at least once, where the implantation dose is about $2 \times 10^{12}$ cm$^{-2}$ to about $1 \times 10^{13}$ cm$^{-2}$, and the acceleration energy is 80 keV or less. The drift diffusion region 10 thus formed has a concentration profile, such as that shown in FIG. 7B, immediately after the implantation.

Next, as shown in FIG. 7C, an oxide film 19 and a nitride film 20 are successively formed on the semiconductor substrate 1, and thereafter, a resist 21 is applied onto the nitride film 20 and then developed, so that an opening is formed in a predetermined region of the resist 21 spaced apart from a region where the body diffusion region 2 is to be formed. Next, the nitride film 20 and the oxide film 19 are successively partially removed by etching using the resist 21 as a mask. Next, the trench 13 is formed in an upper portion of the semiconductor substrate 1 (the drift diffusion region 10) by etching. Here, the trench 13 has a depth of, for example, about 0.4-2.0 μm, and reaches at least the surface region 12.

Next, as shown in FIG. 7D, n-type impurity ions are implanted into the semiconductor substrate 1 using the resist 21 as a mask to form the n-type drift diffusion portion 15 in a region of the semiconductor substrate 1 which is located at a bottom surface portion of the trench 13. The n-type impurity concentration of the drift diffusion portion 15 is higher than that at the same depth of the substrate inner region 11.

In this step, the n-type impurity which is implanted is, for example, phosphorus. The implantation dose is about $1 \times 10^{12}$ cm$^{-2}$ to about $1 \times 10^{13}$ cm$^{-2}$. The acceleration energy is 100 keV or less. The semiconductor substrate 1 at the same depth as that of the bottom surface of the trench of the drift diffusion region 10 thus formed has a concentration profile, such as that shown in FIG. 8A, immediately after the implantation.

Next, as shown in FIG. 8B, the resist 21 is removed, and thereafter, for example, the oxide film 14 is formed as an insulating film above the semiconductor substrate 1 by, for example, CVD to fill the trench 13. Next, CMP is performed on the oxide film 14 to remove the oxide film 14 from the nitride film 20. In this planarization process, the nitride film 20 functions as a stopper for the CMP process. Thus, the trench 13 in which the oxide film 14 is buried can be formed simultaneously with an STI structure for isolating elements.

Next, as shown in FIG. 8C, the nitride film 20 and the oxide film 19 are removed by etching, and thereafter, the gate insulating film 4 is formed on the semiconductor substrate 1 by thermal oxidation, and the gate electrode 5 is formed. Here, the gate insulating film 4 has a thickness of, for example, about 2-100 nm. The gate insulating film 4 can be formed simultaneously with the gate insulating film of a low-voltage transistor in a logic portion embedded on the same substrate of the LDMOS transistor of this variation.

Next, as shown in FIG. 8D, the p-type body diffusion region 2 is formed in an upper portion of the semiconductor substrate 1 (the drift diffusion region 10) below an end portion in the gate length direction of the gate electrode 5. Here, p-type impurity ions are implanted into an upper portion of the semiconductor substrate 1 (the drift diffusion region 10) using the gate electrode 5 as a mask under conditions that, for example, the implantation energy is 80-150 keV, the implantation dose is about $1 \times 10^{13}$ cm$^{-2}$ to about $1 \times 10^{14}$ cm$^{-2}$, and the implantation depth is about 0.2-1.2 μm. These implantation conditions are only for illustrative purposes, and may be modified as appropriate, depending on the desired breakdown voltage, threshold, and current capability.

In the LDMOS transistor at the end of this step, as shown in FIG. 9A, the n-type impurity concentration of the drift diffusion portion 15 is higher than that of the substrate inner region 11 formed at the same depth as that of the drift diffusion portion 15, and the n-type impurity concentration of a region contacting the p-type body diffusion region 2 is lower.

Figure 9B:
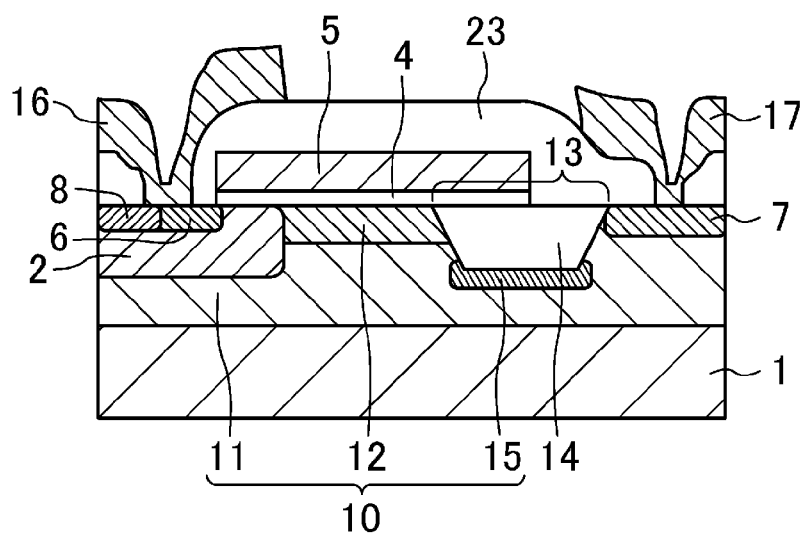
FIG. 9B is a cross-sectional view for describing a step of the method for fabricating the LDMOS transistor of the first variation.

Next, as shown in FIG. 9B, the n-type source diffusion region 6 is formed in an upper portion of the body diffusion region 2 by a known ion implantation technique etc., and the backgate diffusion region 8 containing a p-type impurity at a high concentration (higher than that of the other portion of the body diffusion region 2) is formed in an upper portion of the body diffusion region 2 at a position where the backgate diffusion region 8 and the source diffusion region 6 do not overlap. Simultaneously with the source diffusion region 6, the n-type drain diffusion region 7 is formed in an upper portion of the drift diffusion region 10 in a region which is adjacent to the oxide film 14 on the opposite side of the oxide film 14 (and the gate electrode 5) from the source diffusion region 6.

Next, the interlayer insulating film 23 made of BPSG etc. is formed on the gate electrode 5 and an upper surface of the semiconductor substrate 1. Thereafter, the source electrode 16 made of a metal etc. is formed on the source diffusion region 6 and the backgate diffusion region 8, and the drain electrode 17 made of a metal etc. is formed on the drain diffusion region 7. By the above steps, the LDMOS transistor of FIG. 6 can be fabricated.

According to the method described in this variation, the drift diffusion portion 15 can be formed by ion implantation using the mask for forming the trench 13. Therefore, compared to when a separate mask is fabricated, the resistance of the semiconductor device can be further reduced while reducing or preventing the increase in the number of steps.

Second Variation of Embodiment

Figure 10:
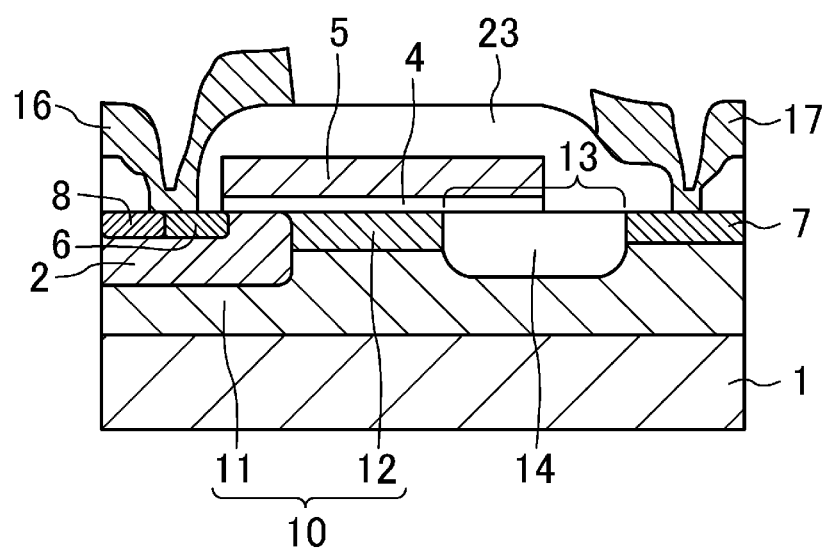
FIG. 10 is a cross-sectional view showing an LDMOS transistor according to a second variation of the embodiment of the present disclosure.

FIG. 10 is a cross-sectional view showing an LDMOS transistor according to a second variation of the embodiment of the present disclosure. The LDMOS transistor of this variation has a configuration similar to that of the LDMOS transistor of FIG. 1, except that a corner portion of the trench 13 is rounded.

In the LDMOS transistor of FIG. 1, the trench 13 is formed between the drain diffusion region 7 and the surface region 12 which is located directly below the gate electrode 5 with the gate insulating film 4 being interposed between the surface region 12 and the gate electrode 5. A cross-section along the longitudinal direction of the trench 13 has an angular corner portion like a trapezoid etc. The trench 13 is formed in an upper portion of the drift diffusion region 10.

In contrast to this, in the LDMOS transistor of the second variation of FIG. 10, the trench 13 has a rounded upper end portion and a rounded bottom corner portion.

When the LDMOS transistor is in the on state, the depletion layer extends from the body diffusion region 2, and therefore, an electric field is more easily concentrated at a corner portion closer to the source diffusion region 6 of the trench 13 than at the other portion. According to the LDMOS transistor of this variation, the upper end portion and bottom corner portion of the trench 13 are rounded, and therefore, compared to the LDMOS transistor of FIG. 1, the concentration of an electric field at the corner portion of the trench 13 can be reduced, whereby a sufficient breakdown voltage can be ensured.

The LDMOS transistor of this variation can be fabricated by the following method.

FIGS. 11A, 11C, 11D, 12A-12D, 13A, and 13B are cross-sectional views for describing steps of the method for fabricating the LDMOS transistor of this variation. FIG. 11B is a diagram showing a distribution of n-type impurity concentration in the semiconductor substrate in the step of FIG. 11A.

Initially, as shown in FIG. 11A, the n-type drift diffusion region 10 is formed in the p-type semiconductor substrate 1. Specifically, n-type impurity ions are implanted two times or more with different implantation energy levels, where the dose for implantation into a shallow position is set to be larger than the dose for implantation into a deep position. As a result, the n-type impurity concentration of the surface region 12 of the drift diffusion region 10 can be made higher than the n-type impurity concentration of the substrate inner region 11.

Here, the n-type impurity which is implanted is, for example, phosphorus. In order to form the substrate inner region 11, the n-type impurity is implanted at least once, where the implantation dose is about $1 \times 10^{12}$ cm$^{-2}$ to about $6 \times 10^{12}$ cm$^{-2}$, and the acceleration energy is 100 keV or more. In order to form the surface region 12, the n-type impurity is implanted at least once, where the implantation dose is about $2 \times 10^{12}$ cm$^{-2}$ to about $1 \times 10^{13}$ cm$^{-2}$, and the acceleration energy is 80 keV or less. The drift diffusion region 10 thus formed has a concentration profile, such as that shown in FIG. 11B, immediately after the implantation.

Next, as shown in FIG. 11C, an oxide film 19 and a nitride film 20 are successively formed on the semiconductor substrate 1.

Next, as shown in FIG. 11D, a resist (not shown) is applied onto the nitride film 20 and then developed, so that an opening is formed in a predetermined region of the resist which is spaced apart from a region where the body diffusion region 2 is to be formed. Next, the nitride film 20 and the oxide film 19 are successively partially removed by etching using the resist as a mask. Thereafter, the resist is removed.

Figure 12A:
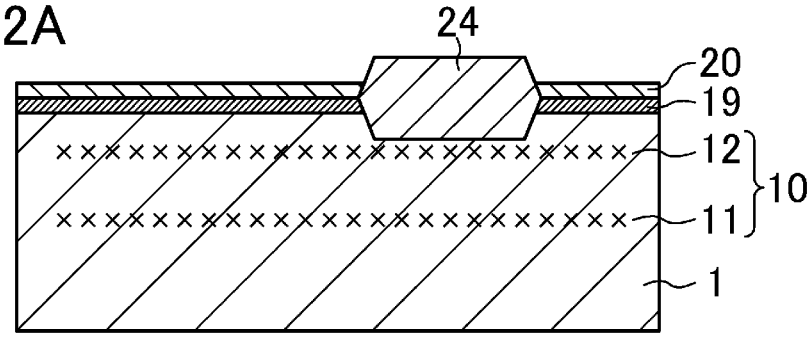
FIGS. 12A-12D are cross-sectional views for describing steps of the method for fabricating the LDMOS transistor of the second variation.

Next, as shown in FIG. 12A, thermal oxidation is selectively performed on an exposed portion of the upper surface portion of the semiconductor substrate 1, so that an oxide film 24 is formed on the upper surface of the semiconductor substrate 1. Here, the oxide film 24 formed by the thermal oxidation has a thickness of, for example, about 0.4-1 μm. The oxide film 24 has a rounded upper end portion and a rounded bottom corner portion. Note that the oxide film 24 may be formed by, for example, immersing the semiconductor substrate in an oxidant, instead of the thermal oxidation.

Figure 12B:
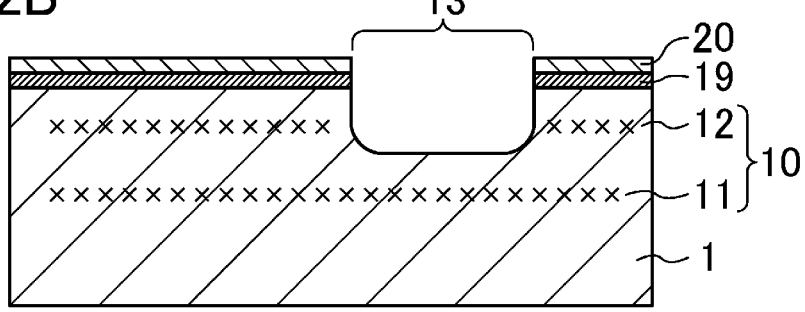

Next, as shown in FIG. 12B, the oxide film 24 is removed by etching, and thereafter, an upper portion of the semiconductor substrate 1 in a region where the oxide film 24 was provided is etched to form the trench 13. Here, the trench 13 has a depth of, for example, about 0.4-2.0 μm.

Figure 12C:
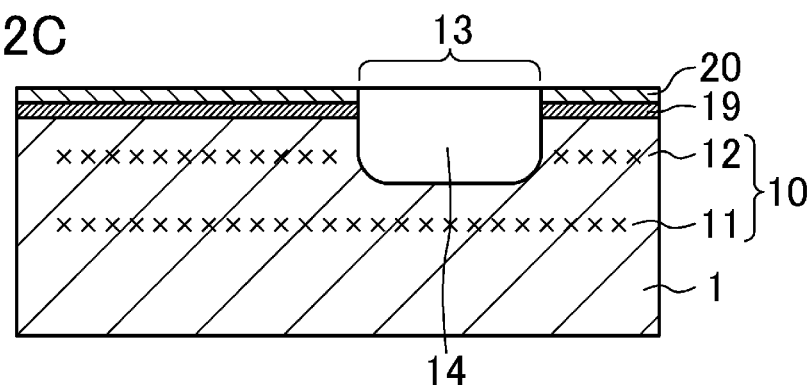

Next, as shown in FIG. 12C, the oxide film 14 is formed on an upper portion of the nitride film 20 and a portion of the semiconductor substrate 1 in which the trench 13 is formed, to fill the trench 13. The oxide film 14 is formed by, for example, CVD. Next, CMP is performed on an upper surface of the oxide film 14 to remove the oxide film 14 from the nitride film 20. In this planarization process, the nitride film 20 functions as a stopper for the CMP process. Thus, the trench 13 in which the oxide film 14 is buried can be formed simultaneously with an STI structure for isolating elements.

Figure 12D:
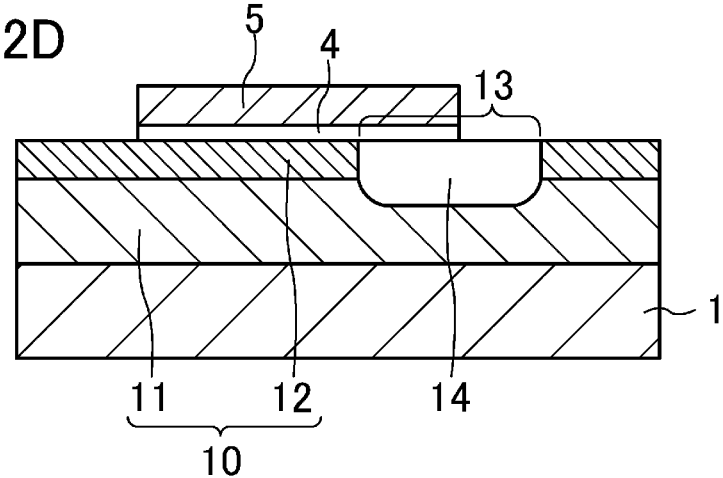

Next, as shown in FIG. 12D, the nitride film 20 and the oxide film 19 are removed by etching, and thereafter, the gate insulating film 4 is formed on the semiconductor substrate 1 by thermal oxidation, and the gate electrode 5 is formed. Here, the gate insulating film 4 has a thickness of, for example, about 2-100 nm. The gate insulating film 4 can be formed simultaneously with the gate insulating film of a low-voltage transistor in a logic portion embedded on the same substrate of the LDMOS transistor of this variation.

Figure 13A:
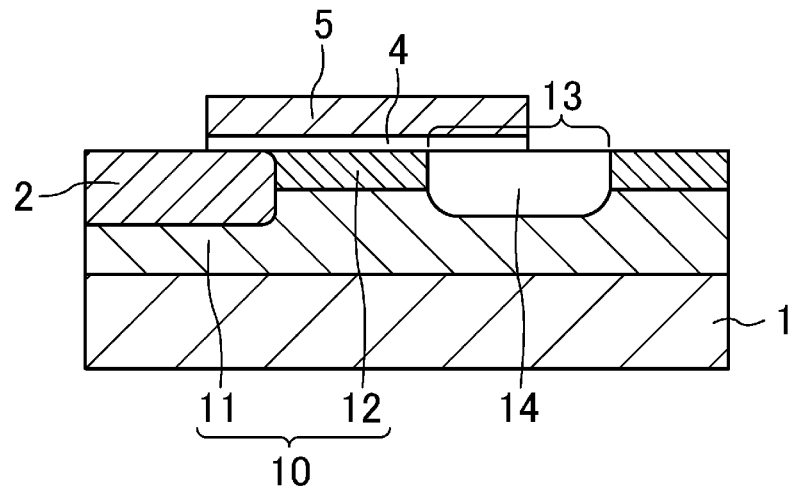
FIGS. 13A and 13B are cross-sectional views for describing steps of the method for fabricating the LDMOS transistor of the second variation.

Next, as shown in FIG. 13A, the p-type body diffusion region 2 is formed in an upper portion of the semiconductor substrate 1 (the drift diffusion region 10) below an end portion in the gate length direction of the gate electrode 5. Here, p-type impurity ions are implanted into the upper portion of the semiconductor substrate 1 (the drift diffusion region 10) using the gate electrode 5 as a mask under conditions that, for example, the implantation energy is 80-150 keV, the implantation dose is about $1 \times 10^{13}$ cm$^{-2}$ to about $1 \times 10^{14}$ cm$^{-2}$, and the implantation depth is about 0.2-1.2 μm. These implantation conditions are only for illustrative purposes, and may be modified as appropriate, depending on the desired breakdown voltage, threshold, and current capability.

Figure 13B:
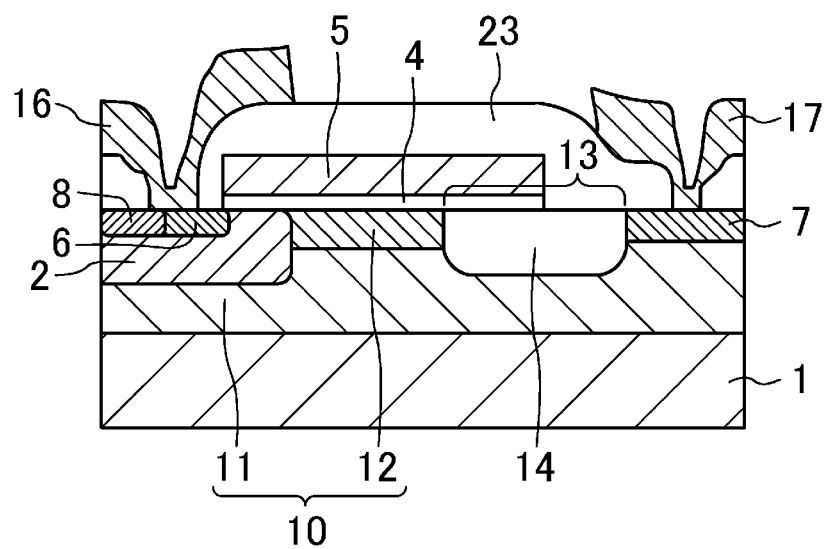

Next, as shown in FIG. 13B, the n-type source diffusion region 6 is formed in an upper portion of the body diffusion region 2 by a known ion implantation technique etc., and the backgate diffusion region 8 containing a p-type impurity at a high concentration (higher than that of the other portion of the body diffusion region 2) is formed in an upper portion of the body diffusion region 2 at a position where the backgate diffusion region 8 and the source diffusion region 6 do not overlap. Simultaneously with the source diffusion region 6, the n-type drain diffusion region 7 is formed in an upper portion of the drift diffusion region 10 in a region which is adjacent to the oxide film 14 on the opposite side of the oxide film 14 (and the gate electrode 5) from the source diffusion region 6.

Next, the interlayer insulating film 23 made of, for example, BPSG etc. is formed on the gate electrode 5 and an upper surface of the semiconductor surface 1. Thereafter, the source electrode 16 made of a metal etc. is formed on the source diffusion region 6 and the backgate diffusion region 8, and the drain electrode 17 made of a metal etc. is formed on the drain diffusion region 7. By the above steps, the LDMOS transistor of FIG. 10 can be fabricated.

Third Variation of Embodiment

Figure 14:
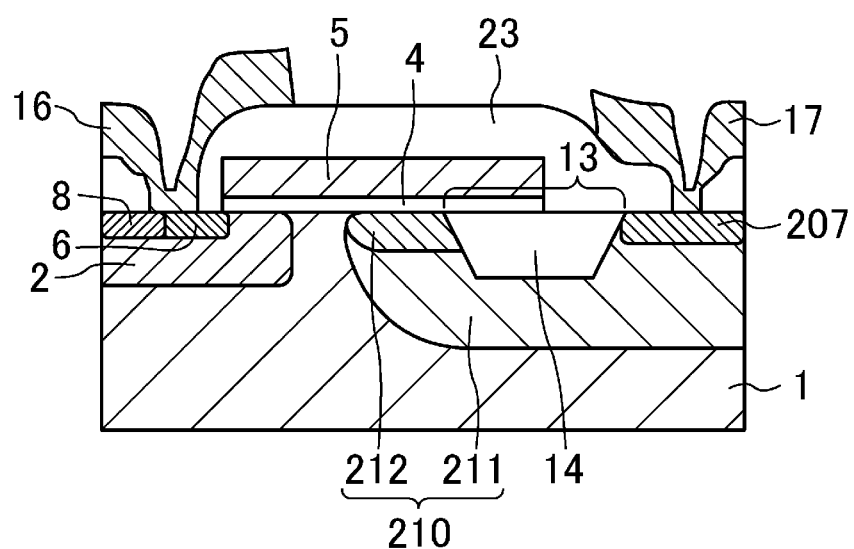
FIG. 14 is a cross-sectional view showing an LDMOS transistor according to a third variation of the embodiment of the present disclosure.

FIG. 14 is a cross-sectional view showing a LDMOS transistor according to a third variation of the embodiment of the present disclosure. As shown in FIG. 14, the LDMOS transistor of this variation is different from the LDMOS transistor of FIG. 1 in that an n-type drift diffusion region 210 formed in an upper portion of the semiconductor substrate 1 is not formed below the source diffusion region 6, and is spaced apart from the p-type body diffusion region 2.

The drift diffusion region 210 is formed to cover side surfaces and a bottom surface of the oxide film 14 buried in the trench 13. The drift diffusion region 210 includes a substrate inner region 211 formed below the oxide film 14 and a drain diffusion region 207, and a surface region 212 which is located on the substrate inner region 211 and below the gate electrode 5 with the gate insulating film 4 being interposed between the surface region 212 and the gate electrode 5, and containing an n-type impurity at a higher concentration than that of the substrate inner region 211.

The LDMOS transistor includes the gate insulating film 4 formed on a portion of the body diffusion region 2, the surface region 212, and a portion of the oxide film 14; the gate electrode 5 formed on the gate insulating film 4; the interlayer insulating film 23 formed on the gate electrode 5 and the semiconductor substrate 1 and having openings above the source diffusion region 6 and the backgate diffusion region 8 and above the drain diffusion region 7; the source electrode 16 formed on a portion of the source diffusion region 6 and a portion of the backgate diffusion region 8; and the drain electrode 17 formed on the drain diffusion region 7.

In the LDMOS transistor of this variation, the n-type impurity concentration of the surface region 212 of the drift diffusion region 210 which serves as a carrier path during the on state is higher than that of the substrate inner region 211, whereby the resistance of the surface region 212 is reduced compared to conventional LDMOS transistors, resulting in a reduction in the on resistance.

Note that, in a typical LDMOS transistor including an offset region formed by LOCOS, such as that shown in FIG. 17, if the impurity concentration of the surface region of the drift diffusion region is increased, an electric field is concentrated at the bird's beak portion of the end portion closer to the source diffusion region 306 of the LOCOS oxide film 303, resulting in a decrease in the breakdown voltage. In other words, in the typical LDMOS transistor, an electric field is likely to be concentrated in the vicinity of the end portion closer to the drain diffusion region 7 of the gate electrode 5.

In contrast to this, in the LDMOS transistor of this variation of FIG. 14, the trench 13 is formed in a region of the semiconductor substrate 1 which is located in the vicinity of the end portion closer to the drain diffusion region 7 of the gate electrode 5. Thus, the surface region 212 having a high impurity concentration is removed from the region in the vicinity of the end portion. Therefore, the concentration of an electric field at a portion of the drift diffusion region 210 which is located in the vicinity of the end portion closer to the drain diffusion region 7 of the gate electrode 5 can be reduced, whereby the decrease in the breakdown voltage can be reduced.

With this configuration, the body diffusion region 2 and the drift diffusion region 210 do not contact each other, and there is the p-type region of the semiconductor substrate 1 between the body diffusion region 2 and the drift diffusion region 210. Therefore, in the LDMOS transistor of this variation, the breakdown voltage is improved compared to the LDMOS transistor of FIG. 1. Therefore, the LDMOS transistor of this variation is preferably useful for an application in which a high voltage is applied.

Next, a method for fabricating the LDMOS transistor of this variation will be described. FIGS. 15A, 15C, 15D, and 16A-16C are cross-sectional views for describing steps of the method for fabricating the LDMOS transistor of this variation. FIG. 15B is a diagram showing a distribution of n-type impurity concentration in the semiconductor substrate in the step of FIG. 15A. FIG. 16D is a plan view showing the LDMOS transistor after the end of the step of FIG. 16C.

Figure 15A:
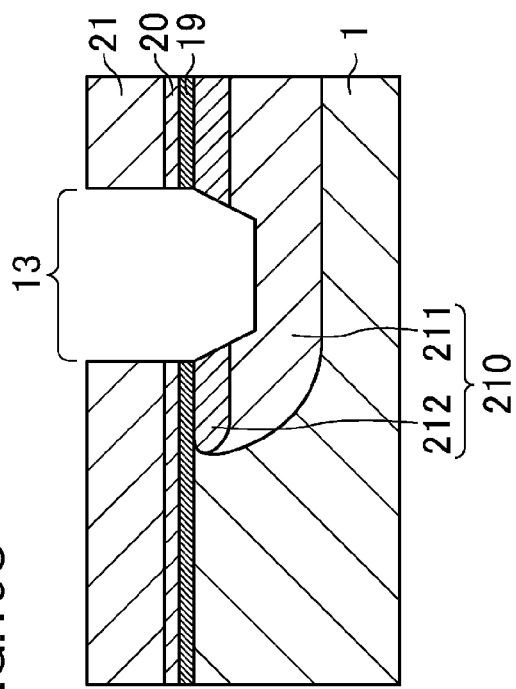
FIGS. 15A, 15C, and 15D are cross-sectional views for describing steps of the method for fabricating the LDMOS transistor of the third variation.
Figure 15B:
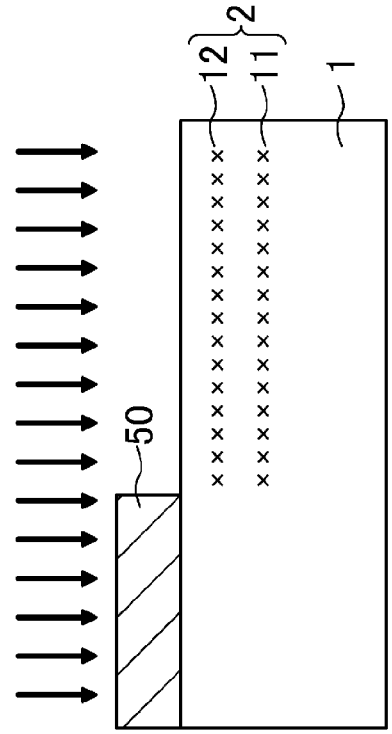
FIG. 15B is a diagram showing a distribution of n-type impurity concentration in the semiconductor substrate in the step of FIG. 15A.

Initially, as shown in FIG. 15A, the n-type drift diffusion region 210 is formed in the p-type semiconductor substrate 1.

Specifically, a resist 50 is formed to cover a region of the semiconductor substrate 1 in which a source diffusion region is to be formed. Next, n-type impurity ions are implanted two times or more with different implantation energy levels using the resist 50 as a mask, where the dose for implantation into a shallow position is set to be larger than the dose for implantation into a deep position. As a result, the n-type impurity concentration of the surface region 212 of the drift diffusion region 210 can be made higher than the n-type impurity concentration of the substrate inner region 211.

Here, the n-type impurity which is implanted is, for example, phosphorus. In order to form the substrate inner region 211, the n-type impurity is implanted at least once, where the implantation dose is about $1 \times 10^{12}$ cm$^{-2}$ to about $6 \times 10^{12}$ cm$^{-2}$, and the acceleration energy is 100 keV or more. In order to form the surface region 212, the n-type impurity is implanted at least once, where the implantation dose is about $2 \times 10^{12}$ cm$^{-2}$ to about $1 \times 10^{13}$ cm$^{-2}$, and the acceleration energy is 80 keV or less. The drift diffusion region 210 thus formed has a concentration profile, such as that shown in FIG. 15B, immediately after the implantation.

Figure 15C:
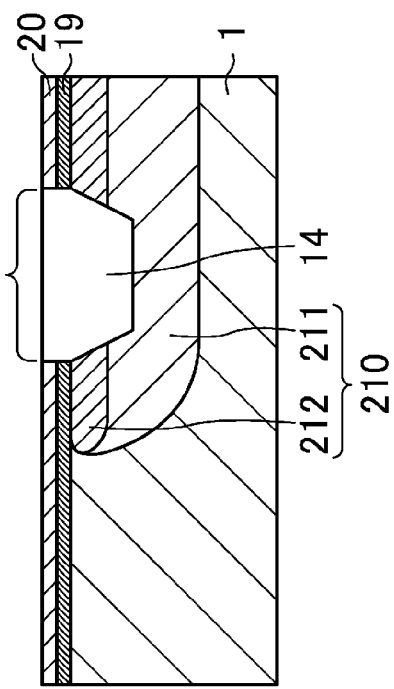

Next, as shown in FIG. 15C, an oxide film 19 and a nitride film 20 are successively formed on the semiconductor substrate 1, and thereafter, a resist 21 is applied onto the nitride film 20 and then developed, so that an opening is formed in a predetermined region of the resist 21 which is spaced apart from a region where the body diffusion region 2 is to be formed. Next, the nitride film 20 and the oxide film 19 are successively partially removed by etching using the resist 21 as a mask. Next, the trench 13 is formed in an upper portion of the semiconductor substrate 1 (the drift diffusion region 210) by etching. Here, the trench 13 has a depth of, for example, about 0.4-2.0 μm, and reaches at least the surface region 212.

Figure 15D:
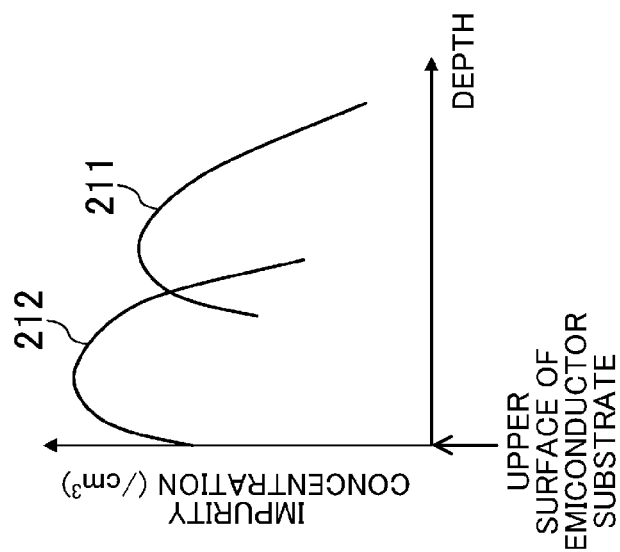

Next, as shown in FIG. 15D, the resist 21 is removed, and thereafter, for example, the oxide film 14 is formed as an insulating film above the semiconductor substrate 1 by, for example, CVD to fill the trench 13. Next, CMP is performed on the oxide film 14 to remove the oxide film 14 from the nitride film 20. In this planarization process, the nitride film 20 functions as a stopper for the CMP process. Thus, the trench 13 in which the oxide film 14 is buried can be formed simultaneously with an STI structure for isolating elements.

Figure 16A:
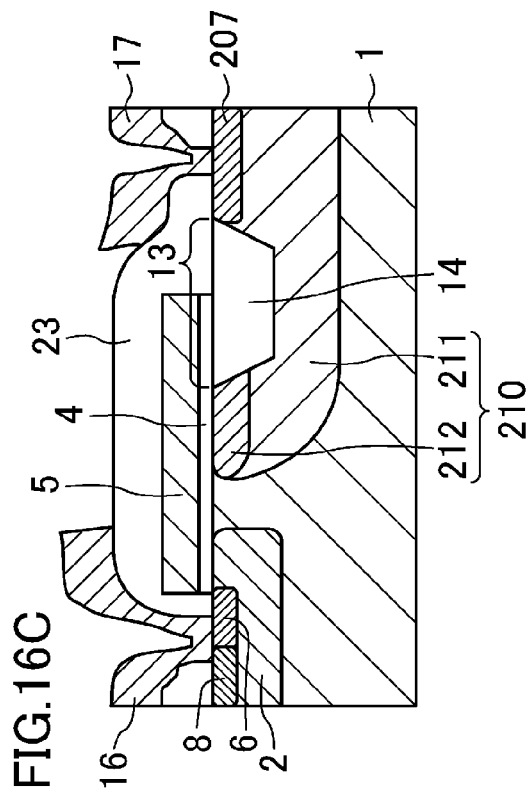
FIGS. 16A-16C are cross-sectional views for describing steps of the method for fabricating the LDMOS transistor of the third variation.
Figure 16D:
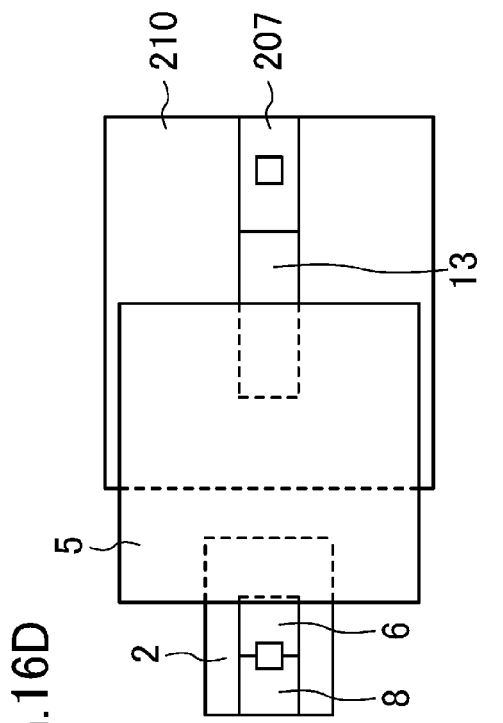
FIG. 16D is a plan view showing the LDMOS transistor after the end of the step of FIG. 16C.

Next, as shown in FIG. 16A, the nitride film 20 and the oxide film 19 are removed by etching, and thereafter, the gate insulating film 4 is formed on the semiconductor substrate 1 by thermal oxidation, and the gate electrode 5 is formed. Here, the gate insulating film 4 has a thickness of, for example, about 2-100 nm. The gate insulating film 4 can be formed simultaneously with the gate insulating film of a low-voltage transistor in a logic portion embedded on the same substrate of the LDMOS transistor of this variation.

Figure 16B:
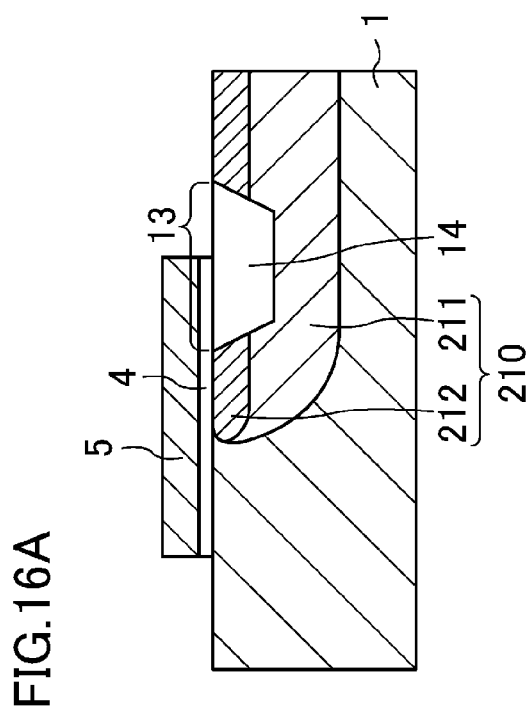

Next, as shown in FIG. 16B, the p-type body diffusion region 2 is formed in a region which is located in an upper portion of the semiconductor substrate 1 and does not contact the drift diffusion region 210. Here, p-type impurity ions are implanted into an upper portion of the semiconductor substrate 1 using the gate electrode 5 as a mask under conditions that, for example, the implantation energy is 80-150 keV, the implantation dose is about $1 \times 10^{13}$ cm$^{-2}$ to about $1 \times 10^{14}$ cm$^{-2}$, and the implantation depth is about 0.2-1.2 μm. These implantation conditions are only for illustrative purposes, and may be modified as appropriate, depending on the desired breakdown voltage, threshold, and current capability.

Figure 16C:
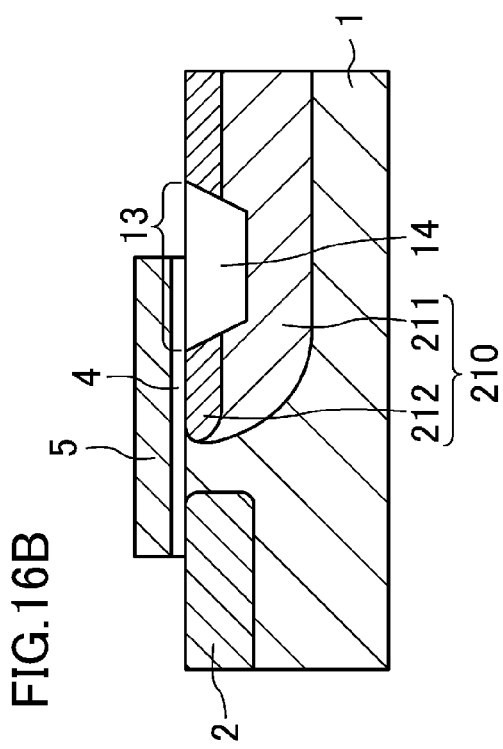

Next, as shown in FIGS. 16C and 16D, the n-type source diffusion region 6 is formed in an upper portion of the body diffusion region 2 by a known ion implantation technique etc., and the backgate diffusion region 8 containing a p-type impurity at a high concentration (higher than that of the other portion of the body diffusion region 2) is formed in an upper portion of the body diffusion region 2 at a position where the backgate diffusion region 8 and the source diffusion region 6 do not overlap. Simultaneously with the source diffusion region 6, the n-type drain diffusion region 7 is formed in an upper portion of the drift diffusion region 210 in a region which is adjacent to the oxide film 14 on the opposite side of the oxide film 14 (and the gate electrode 5) from the source diffusion region 6.

Next, the interlayer insulating film 23 made of, for example, BPSG etc. is formed on the gate electrode 5 and an upper surface of the semiconductor surface 1. Thereafter, the source electrode 16 made of a metal etc. is formed on the source diffusion region 6 and the backgate diffusion region 8, and the drain electrode 17 made of a metal etc. is formed on the drain diffusion region 7. By the above steps, the LDMOS transistor of FIG. 14 can be fabricated.

Note that, as described above, the configurations of the semiconductor devices according to the embodiment and variations may be combined as appropriate. For example, in the LDMOS transistor of the third variation, a corner portion of the trench 13 may be rounded, and the drift diffusion portion 15 (see FIG. 6) having a higher n-type impurity concentration than that of the substrate inner region 211 may be provided in a portion of the drift diffusion region 210 which is located at a bottom portion of the trench 13.

The order of the steps of the fabricating method, the conditions for ion implantation and etching, etc. may be changed and modified as appropriate within allowable ranges.

As described above, in an LDMOS transistor according to an example of the present disclosure, the on resistance can be reduced while keeping a sufficient breakdown voltage. Therefore, the LDMOS transistor can be effectively used as a high-breakdown voltage device which is used in the presence of an applied voltage as high as, for example, 10-40 V, in the fields of driver IC, power supply IC, etc.

Given the variety of embodiments of the present disclosure just described, the above description and illustrations should not be taken as limiting the scope of the present disclosure which is defined by the appended claims.

While the disclosure has been particularly shown and described with reference to the preferred embodiment and variations thereof, it will be understood by those skilled in the art that various changes in form and details may be made without departing from the spirit and scope of the disclosure. It is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprising:
a drift diffusion region of a first conductivity type formed in an upper portion of a semiconductor substrate;
a body diffusion region of a second conductivity type formed in an upper portion of the drift diffusion region;
a source diffusion region of the first conductivity type formed in an upper portion of the body diffusion region;
an insulating film buried in a trench formed in an upper portion of the drift diffusion region, and spaced apart from the body diffusion region;
a drain diffusion region of the first conductivity type formed in an upper portion of the drift diffusion region and adjacent to the insulating film on an opposite side of the insulating film from the source diffusion region; and
a gate electrode formed on a portion of the body diffusion region, the drift diffusion region, and a portion of the insulating film with a gate insulating film being interposed between the gate electrode, and the portion of the body diffusion region, the drift diffusion region, and the portion of the insulating film,
wherein
the drift diffusion region includes both a substrate inner region and a surface region, said surface region directly contacts the body diffusion region,
the surface region is formed between the substrate inner region and the gate electrode, and
the surface region contains an impurity of the first conductivity type at a higher concentration than that of the substrate inner region.

2. The semiconductor device of claim 1, wherein a portion of the drift diffusion region located at a bottom portion of the trench contains the impurity of the first conductivity type at a higher concentration than that of the substrate inner region located at a same depth.

3. The semiconductor device of claim 1, wherein an upper end portion and a bottom corner portion of the trench are rounded.

4. The semiconductor device of claim 1, wherein the concentration of the impurity of the first conductivity type contained in the drift diffusion region is lower than the concentration of the impurity of the first conductivity type contained in the source and drain diffusion regions.

5. The semiconductor device of claim 1,
wherein the surface region of the drift diffusion region has substantially the same depth along an interface with the substrate inner region of the drift diffusion region.

6. The semiconductor device of claim 1, wherein
the surface region of the drift diffusion region has a first length in a depth direction and a second length in a direction perpendicular to the depth direction, and
the second length is larger than the first length.

7. A semiconductor device comprising:
a drift diffusion region of a first conductivity type formed in an upper portion of a semiconductor substrate;
a body diffusion region of a second conductivity type formed in an upper portion of the semiconductor substrate;
a source diffusion region of the first conductivity type formed in an upper portion of the body diffusion region;
an insulating film buried in a trench formed in an upper portion of the drift diffusion region, and spaced apart from the body diffusion region;
a drain diffusion region of the first conductivity type formed in an upper portion of the drift diffusion region and adjacent to the insulating film on an opposite side of the insulating film from the source diffusion region; and
a gate electrode formed on a portion of the body diffusion region, the drift diffusion region, and a portion of the insulating film with a gate insulating film being interposed between the gate electrode, and the portion of the body diffusion region, the drift diffusion region, and the portion of the insulating film,
wherein the drift diffusion region includes both a substrate inner region, and a surface region formed on the substrate inner region and below the gate electrode and containing an impurity of the first conductivity type at a higher concentration than that of the substrate inner region, and
wherein the body diffusion region and the drift diffusion region are spaced apart from each other, and a portion of the semiconductor substrate which is located between the body diffusion region and the drift diffusion region is of the second conductivity type.

8. The semiconductor device of claim 7, wherein a portion of the drift diffusion region located at a bottom portion of the trench contains the impurity of the first conductivity type at a higher concentration than that of the substrate inner region located at a same depth.

9. The semiconductor device of claim 7, wherein an upper end portion and a bottom corner portion of the trench are rounded.

10. The semiconductor device of claim 7, wherein the concentration of the impurity of the first conductivity type contained in the drift diffusion region is lower than the concentration of the impurity of the first conductivity type contained in the source and drain diffusion regions.

11. The semiconductor device of claim 7,
wherein the surface region of the drift diffusion region has substantially the same depth along an interface with the substrate inner region of the drift diffusion region.

12. The semiconductor device of claim 7, wherein
the surface region of the drift diffusion region has a first length in a depth direction and a second length in a direction perpendicular to the depth direction, and
the second length is larger than the first length.

* * * * *